United States Patent
Moon et al.

(10) Patent No.: US 10,551,033 B2
(45) Date of Patent: Feb. 4, 2020

(54) PHOSPHOR, LIGHT EMITTING DEVICE PACKAGE, AND ELECTRONIC APPARATUS

(71) Applicant: LG DISPLAY CO., LTD., Seoul (KR)

(72) Inventors: JeYoung Moon, Geumsan-gun (KR); SangHo Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 52 days.

(21) Appl. No.: 15/842,012

(22) Filed: Dec. 14, 2017

(65) Prior Publication Data

US 2018/0231212 A1   Aug. 16, 2018

(30) Foreign Application Priority Data

Feb. 10, 2017   (KR) .......................... 10-2017-0018945

(51) Int. Cl.
 *F21V 9/08*   (2018.01)
 *F21K 9/60*   (2016.01)
 *F21Y 113/17*   (2016.01)

(52) U.S. Cl.
 CPC .................. *F21V 9/08* (2013.01); *F21K 9/60* (2016.08); *F21Y 2113/17* (2016.08)

(58) Field of Classification Search
 CPC . F21V 9/08; F21K 9/60; H01L 33/502; H01L 33/48; H01L 25/0753; H01L 33/504; F21Y 2113/17
 See application file for complete search history.

(56) References Cited

U.S. PATENT DOCUMENTS

2008/0048193 A1   2/2008   Yoo et al.
2013/0026506 A1*  1/2013   Arbell .................... C09K 11/02
                                                    257/88
(Continued)

FOREIGN PATENT DOCUMENTS

CN   104302729 A   1/2015
CN   105658762 A   6/2016

OTHER PUBLICATIONS

Duan et al., "High Quantum-yield $CdSe_xS_{1-x}$/ZnS Core/shell Quantum Dots for Warm White Light-emitting Diodes with Good Color Rendering," Nanotechnology, vol. 24, No. 28, 2013 (Published Jun. 20, 2013), 8 pages, XP020247755.

*Primary Examiner* — Bao Q Truong
*Assistant Examiner* — Glenn D Zimmerman
(74) *Attorney, Agent, or Firm* — Birch, Stewart, Kolasch & Birch, LLP

(57) ABSTRACT

A light-emitting device package and an electronic apparatus are discussed. The light light-emitting device package according to an embodiment includes a light emitting device configured to emit light of a first main wavelength band within a visible light wavelength band; and a first phosphor including a first core and a first shell, the first core including a fluorescent material capable of emitting light of a first wavelength band different from the first main wavelength band of the light emitted from the light emitting device. The first shell eliminates light of a specific wavelength band or attenuates an intensity of light of the specific wavelength band from the light of the first wavelength band to emit light of a second main wavelength band within the visible light wavelength band. The light light-emitting device package further includes a second phosphor including a second core.

20 Claims, 22 Drawing Sheets

Type 1-a

(56) References Cited

U.S. PATENT DOCUMENTS

| | | |
|---|---|---|
| 2016/0141463 A1 | 5/2016 | Kurtin et al. |
| 2016/0225947 A1 | 8/2016 | Murayama et al. |
| 2016/0281962 A1 | 9/2016 | Tseng et al. |
| 2016/0372639 A1 | 12/2016 | Mueller et al. |
| 2019/0081219 A1* | 3/2019 | Chen ................ H01L 33/48 |

* cited by examiner

FIG.2
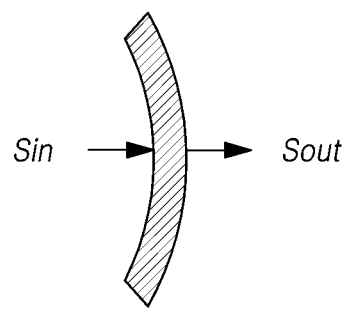
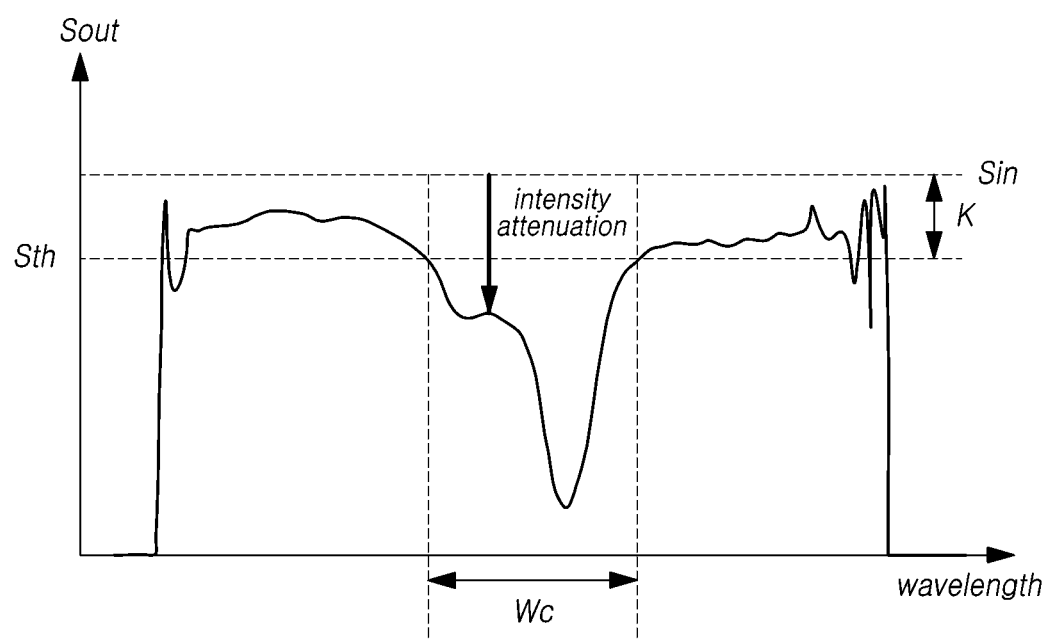

FIG.3
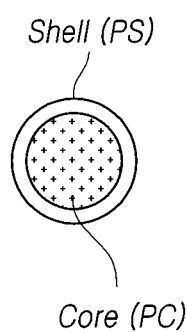
1st Case
Shell (PS)
Core (PC)
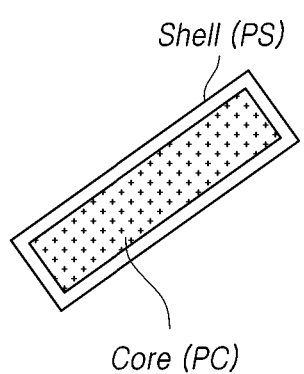
2nd Case
Shell (PS)
Core (PC)
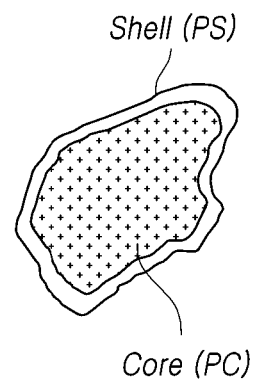
3rd Case
Shell (PS)
Core (PC)

FIG.5
| | Light Emitting Device Package | Light Emitting Device | Phosphor |
|---|---|---|---|
| Type 1 | 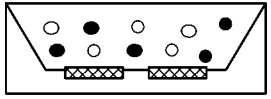 | blue light emitting device | red phosphor green phosphor |
| Type 2 | 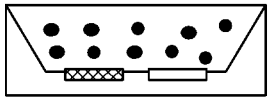 | blue light emitting device red light emitting device | green phosphor |
| Type 3 | 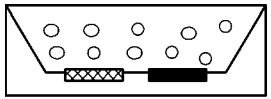 | blue light emitting device green light emitting device | red phosphor |

Type 1-a

FIG.7
green phosphor (P1)
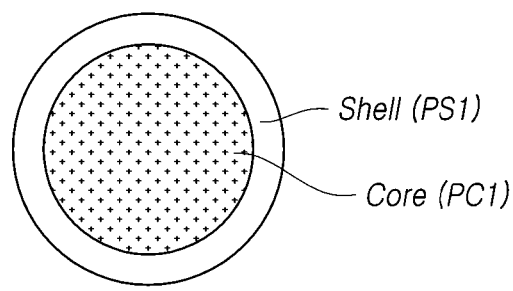
Shell (PS1)
Core (PC1)
red phosphor (P2)
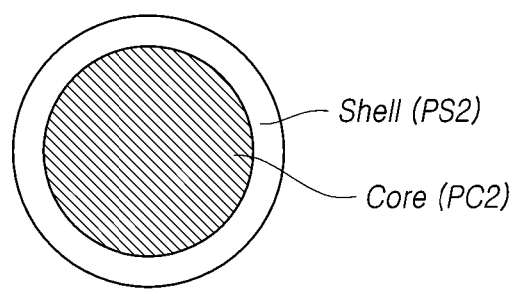
Shell (PS2)
Core (PC2)

FIG.9
green phosphor(P1)
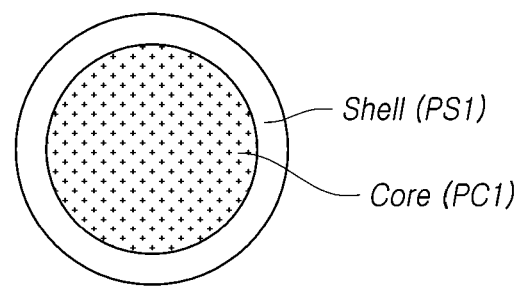
red phosphor (P2)
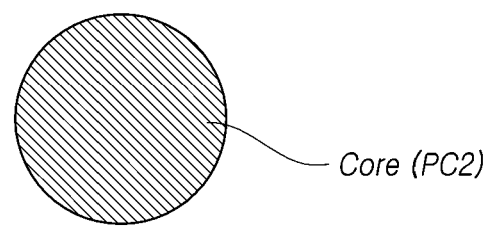

Type 1-c

FIG.11
green phosphor (P2)
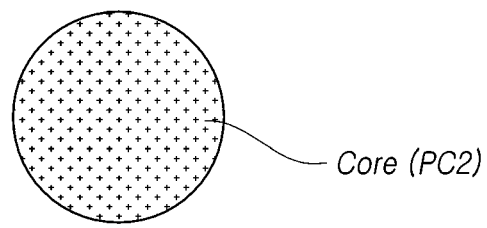
Core (PC2)
red phosphor (P1)
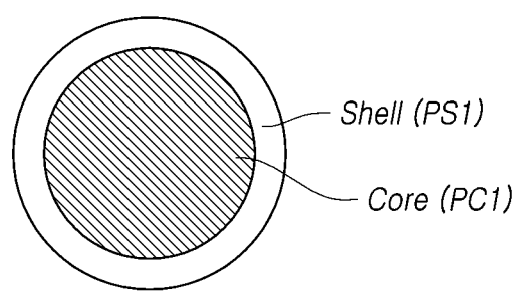
Shell (PS1)
Core (PC1)

Type 3 red phosphor (P1)

PHOSPHOR, LIGHT EMITTING DEVICE PACKAGE, AND ELECTRONIC APPARATUS

CROSS-REFERENCE TO RELATED APPLICATION

This application claims priority from Korean Patent Application No. 10-2017-0018945, filed on Feb. 10, 2017, which is hereby incorporated by reference for all purposes as if fully set forth herein.

BACKGROUND OF THE INVENTION

1. Field of the Invention

The present invention relates to a phosphor, a light-emitting device package, and an electronic apparatus.

2. Description of the Related Art

Nowadays, a display apparatus utilizes as a light source a light-emitting device package including a light-emitting device such as a light-emitting diode (LED) and at least one phosphor. Conventional phosphors used in light-emitting device packages have a problem due to emitted spectrums being wider than wavelength bands corresponding to colors of light intended to be emitted. As a result of the phosphors emitting light spectrums wider than desired, the light emitted by the phosphors is impure. The light emitted by the phosphores is a mixture including undesired colors. Color reproduction capability of the display apparatus employing as the light source the light-emitting device package of related art is degraded due to the decrease of the gamut of pure colors of emitted light.

SUMMARY OF THE INVENTION

Accordingly, an aspect of the present invention is to provide a phosphor having an excellent gamut of pure colors.

Another aspect of the present invention is to provide a light-emitting device package including a phosphor having an excellent gamut of pure colors.

A further aspect of the present invention is to provide an electronic apparatus which employs as a light source a light-emitting device package including a phosphor emitting an excellent gamut of pure colors of light. The electronic apparatus of the present invention including a phosphor that has a core-shell structure exhibits a high capability for reproducing colors.

An aspect of the present invention is to provide a phosphor having a core-shell structure, a light-emitting device package utilizing the same, and an electronic apparatus, such as a display apparatus and an illumination apparatus, using the same.

Another aspect of the present invention is to provide a phosphore including a core that includes a fluorescent material capable of absorbing external light and emitting light of a first wavelength band. The phosphore includes least one shell, applied to a surface of the core, capable of eliminating light of a specific wavelength band from the light of the first wavelength band or emitting light in which an intensity of the light of the specific wavelength band is attenuated.

The core in the phosphor may be heavier than the shell, which may have a weight ratio of 0.6 or less with respect to the core. The weight ratio of the shell to the core in the phospore enables light of selective wavelengths (e.g., wavelengths in a specific wavelength band) corresponding to a part of light (e.g., visible light) emitted from the core to be eliminated, or attenuated in intensity when passing through the shell.

The shell of the phosphor having a core-shell structure may act as a selective wavelength absorption layer or a selective wavelength absorption coating layer. The shell in the phosphor may have a thickness smaller than a distance from a center of the core to a surface of the core. The shell in the phosphor may have a thickness from 2,000 nm-500,000 nm.

A further aspect of the present invention is to provide a light-emitting device package including a first light emitting device for emitting light of a first main wavelength band within a visible light wavelength band; and a first phosphor including a first core and at least one first shell applied to a surface of the first core, the first core including a fluorescent material capable of emitting light of a first wavelength band different from the first main wavelength band of the light emitted from the first light emitting device, the first shell eliminating light of a first specific wavelength band or attenuating an intensity of light of a first specific wavelength band from the light of the first wavelength band to emit light of a second main wavelength band within the visible light wavelength band.

The first shell applied to the surface of the first core may include a material exhibiting a first light transmission property of attenuating an intensity of the light of the first specific wavelength band to less than a threshold intensity and outputting the attenuated light after the incidence of light.

In the first phosphor, the first shell may have a weight ratio of 0.6 or less with regard to the first core. A weight ratio of the first shell to the first core may be set in such a manner that the intensity attenuation of the light of a first specific wavelength band is a certain level or greater. A thickness of the first shell may range from 2,000 nm-500,000 nm, and may be determined such that the intensity attenuation of the light of a first specific wavelength band is a certain level or greater.

In the first phosphor, the first shell may include at least one rare earth metal. The first core includes at least one selected from among $(Sr,Ba,Mg)2SiO4:Eu$, $A25Lu3O12:Ce$, $(Sr,Ba,Mg)2SiO4:Eu$, $Y3Al5O12:Ce$, $La3Si6N11:Ce$, $(Sr,Ba,Eu)2SiO4:Eu$, $\beta$-Sialon:$Si6-zAlzOzN8-z:Eu$, $Lu3Al5O12:Ce$, $(Lu, Gd)3A25O12:Ce$, and $Y3A25O12:Ce$ $(0.01<z<10)$.

The light-emitting device package may further include a second phosphor composed of a second core and a second shell applied to a surface of the second core. The second core includes a fluorescent material capable of emitting light of a second wavelength band different from the first main wavelength band of the light emitted from the first light emitting device. The second shell eliminates light of a second specific wavelength band or attenuates an intensity of light of a second specific wavelength band from the light of the second wavelength band to emit light of a third main wavelength band within the visible light wavelength band.

In the second phosphor, the second shell may include a material exhibiting a second light transmission property of attenuating an intensity of the light of the second specific wavelength band to less than a threshold intensity and outputting the attenuated light after the incidence of light.

The first specific wavelength band may be identical to or overlap with the second specific wavelength band. In addition, the first wavelength band may be different from the second specific wavelength band.

A weight ratio of the first shell to the first core in the first phosphor may be identical to that of the second shell to the second core in the second phosphor. A weight ratio of the first shell to the first core in the first phosphor may be different from that of the second shell to the second core in the second phosphor.

In the second phosphor, the second shell may have a weight ratio of 0.6 or less with regard to the second core. The weight ratio of the second shell to the second core in the second phosphor may be set in such a manner that the intensity of attenuation of the light of a second specific wavelength band is a certain level or greater.

The first shell of the first phosphor may be identical in thickness to the second shell of the second phosphor.

The first shell of the first phosphor may be different in thickness from the second shell of the second phosphor.

The first shell of the first phosphor may be thicker than the second shell of the second phosphor.

The second shell of the second phosphor may range in thickness from 2,000 nm-500,000 nm.

In the second phosphor, the thickness of the second shell may be determined in such a manner that the intensity attenuation of the light of a second specific wavelength band is a certain level or greater.

The second shell of the second phosphor may include at least one rare earth element.

The second core of the second phosphor may include at least one selected from among $(Sr,Ba,Mg)_3SiO_5:Eu$, $(Sr,Ca)AlSiN_3:Eu$, $CaAlSiN_3:Eu$, $MyM'z(Si,B,Al)5OxN8-x:Eu$, $MSi1-zAlzOzN2-z:Eu$, $\alpha$-Sialon:$CaxEuy(Si,Al)12(O,N)16$, S-CaAlSiN, CaAlSiN, $(Sr,Ca)AlSiN_3:Eu$, $K_2SiF_6:Mn4+$ ($0.01 < x < 10$, $0.01 < y < 20$, $0.01 < z < 10$, M and M' are each selected from among Ca, Sr, and Ba).

The light-emitting device package may further include a second phosphor composed of a second core including a fluorescent material capable of emitting light of a second wavelength band different from the first main wavelength band of the light emitted from the first light emitting device.

For example, the first light emitting device may be a blue light emitting device capable of emitting blue light. The first phosphor may be a green phosphor capable of emitting green light or a red phosphor capable of emitting red light. The second phosphor may be a red phosphor or a green phosphor.

The light-emitting device package, which includes the first light emitting device, may further include a second light emitting device capable of emitting light of a third main wavelength band within the visible light wavelength band. The second light emitting device may be a green light emitting device capable of emitting green light or a red light emitting device capable of emitting red light.

Still another aspect of the present invention is to provide an electronic apparatus including a light emitting device package including a first light emitting device for emitting light of a first main wavelength band within a visible light wavelength, and a first phosphor for emitting light of a second main wavelength band different from the first main wavelength band. The electronic apparatus includes a driving circuit for driving the first light emitting device.

In the electronic apparatus, the first phosphor includes a first core including a fluorescent material capable of emitting light of a first wavelength band different from the first main wavelength band of the light emitted from the first light emitting device; and at least one first shell, applied to a surface of the first core, capable of emitting light of the second main wavelength band within the visible light wavelength band by eliminating the light of the first specific wavelength band or by attenuating an intensity of the light of the first specific wavelength from the light of the first wavelength band.

A still further aspect of the present invention is to provide an electronic apparatus including a phosphor composed of a core and at least one shell applied to a surface of the core. The core includes a fluorescent material capable of emitting light of a wavelength band different from a first pure color wavelength band, and the shell is capable of emitting light of a second pure color wavelength band within a visible color wavelength band by eliminating light of a specific wavelength band or by attenuating an intensity of light of a specific wavelength from the light emitted from the core.

According to some embodiments thereof, the present invention can provide a phosphor that exhibits an excellent gamut of pure colors by means of a core-shell structure.

According to some embodiments thereof, the present invention can provide a light-emitting device package comprising a phosphor having a core-shell structure.

According to some embodiments thereof, the present invention can provide an electronic apparatus that employs as a light source a light-emitting device package inclusive of a phosphor having a core-shell structure to exhibit high color reproduction capability.

According to some embodiments thereof, the present invention provides an electronic apparatus that uses a phosphor having a core-shell structure to exhibit high color reproduction capability.

BRIEF DESCRIPTION OF THE DRAWINGS

The above and other objects, features and advantages of the present invention will be more apparent from the following detailed description taken in conjunction with the accompanying drawings, in which:

FIG. 2 is a view showing light transmission properties of the shell in a phosphor having a core-shell structure according to some embodiments of the present invention;

FIG. 3 shows various forms of the phosphor having a core-shell structure according to some embodiments of the present invention;

FIG. 5 is a view illustrates three types of light emitting device packages utilizing an phosphor having a core-shell structure according to some embodiments of the present invention.

FIGS. 6 and 7 are diagrams respectively showing light-emitting device package of Type 1-a including one kind of light emitting device (blue light emitting device) and two kinds of phosphors (red phosphors and green phosphors), and red phosphors and green phosphors, each having a core-shell structure;

Next, FIGS. 8 and 9 are diagrams respectively showing a light-emitting device package of Type 1-b including one kind of light emitting device (blue light emitting device) and two kinds of phosphors (green phosphors and red phosphors), and a green phosphor having a core-shell structure and a red phosphor having a structure according to the present application.

FIGS. 10 and 11 are diagrams respectively showing a light-emitting device package of Type 1-c including one kind of light emitting device (blue light emitting device) and two kinds of phosphors (red phosphors and green phosphors), and a red phosphor having a core-shell structure and a green phosphor having a structure to the present application.

DETAILED DESCRIPTION OF THE EXEMPLARY EMBODIMENTS

Figure 1:
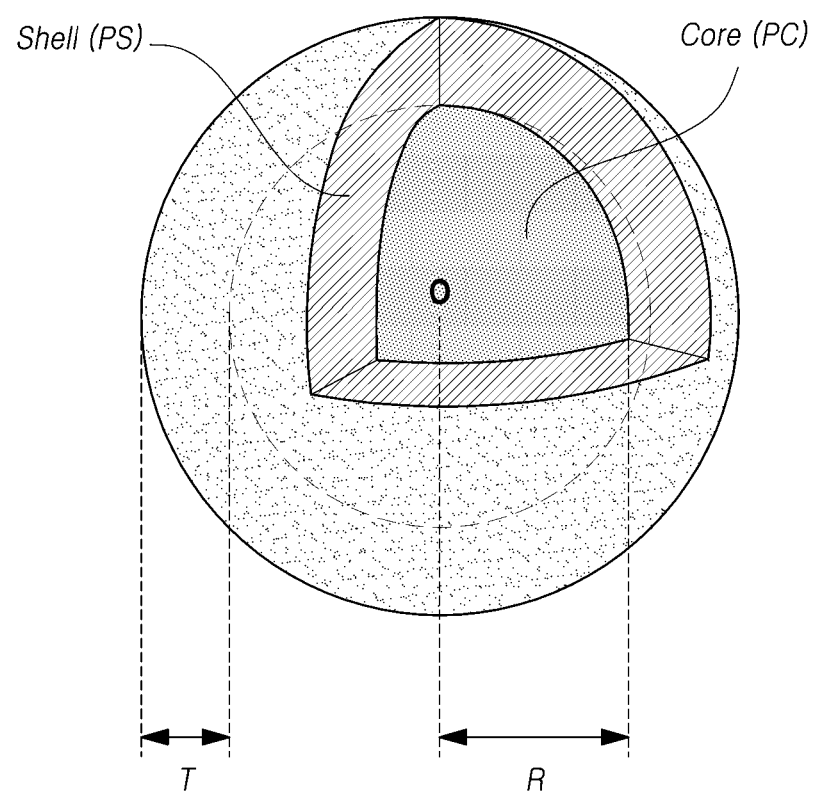
FIG. 1 is a diagram illustrating a phosphor having a core-shell structure according to some embodiments of the present invention.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may obfuscate the subject matter of the present invention.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a diagram illustrating a phosphor (P) having a core-shell structure according to some embodiments of the present invention and FIG. 2 is a view showing light transmission properties of the shell (PS) in a phosphor (P) having a core-shell structure according to some embodiments of the present invention.

With reference to FIG. 1, the phosphor (P) according to some embodiments of the present invention has a core-shell structure composed of a core (PC) including a phosphorescent material, and at least one shell (PS) wrapping the core (PC).

The core (PC) of the phosphor (P) includes a phosphorescent material that absorbs first pure-color light of a first pure-color wavelength band and emits the light of a wavelength band different from the first pure color wavelength band. As used herein, the expression "two wavelength bands are different from each other" is intended to encompass both a case where two wavelength bands do not overlap each other at all and a case where two wavelength bands overlap each other in part.

At least one shell (PS) of the phosphor (P) is applied to the surface of the core (PC) and can emit second pure-color light of a second pure-color wavelength band by eliminating the light of a specific wavelength band or attenuating the intensity of the light of a specific wavelength band from the light of wavelength bands emitted from the core (PC).

The shell (PS) of the phosphor (P) includes a material having the light transmission property of attenuating the intensity of the light of a specific wavelength band (e.g., B-G mixed color wavelength band or G-R mixed color wavelength band) to less than a threshold intensity and outputting the attenuated light after the incidence of light.

Next, FIG. 2 is a graph showing light transmission properties of the shell (PS) of the phosphor (P), in which when light with intensity Sin is incident on the shell (PS), the intensity Sout of the light (e.g., output light) emitted from the shell (PS) is depicted depending on the wavelengths of the incident light.

When incident light with wavelengths outside of a specific wavelength band (Wc) is irradiated to the shell (PS), the intensity Sout of the light emitted from the shell (PS) may be lowered below the intensity Sin of the incident light by normal attenuation, but still stays higher than a threshold intensity Sth.

After light with wavelengths outside of a specific wavelength band (Wc) is incident on the shell (PS), the light intensity attenuation (Sin-Sout) in the shell (PS) may remain less than a certain level (K). When light with a wavelength inside of a specific wavelength band (Wc) is incident on the shell (PS), the intensity Sout of the light emitted from the shell (PS) is lowered below a threshold intensity Sth as well as the intensity Sin of the incident light.

After light with wavelengths inside of a specific wavelength band (Wc) is incident on the shell (PS), the light intensity attenuation (Sin-Sout) in the shell (PS) may be a certain level (K) or greater. The shell (PS) of the phosphor (P) attenuates the intensity of the light of a specific wavelength band (Wc) or removes the light of a specific wavelength band (Wc) by absorbing the light of the specific wavelength band (Wc).

The first pure-color light absorbed by the core (PC) of the phosphor (P) may be pure blue light. The second pure-color light emitted from the shell (PS) of the phosphor (P) may be pure green or red light.

In the case where the core (PC) of the phosphor (P) absorbs pure blue light and the shell (PS) of the phosphor (P) emits pure green light by controlling a mixed color range of green and red lights, corresponding wavelength properties are associated with the phosphor (P). The first pure-color wavelength band of the light absorbed by the core (PC) of the phosphor (P) is a wavelength band of pure blue light (hereinafter blue wavelength band), covering a range of approximately 380-500 nm.

The wavelength band of the light that the core (PC) of the phosphor (P) emits may include a wavelength band of pure green light (hereinafter green wavelength band) that is approximately 500-550 nm, and may include a wavelength band of green and red color-mixed light (hereinafter G-R mixed color wavelength band) that is approximately 550-600 nm and ranges from approximately 500-600 nm. 500 to 600 nm. The specific wavelength band eliminated or attenuated by the shell (PS) of the phosphor (P) may be the G-R mixed color wavelength band and may range from approximately 550 to 600 nm.

The second pure-color wavelength band of the light emitted from the shell (PS) of the phosphor (P) may be a green wavelength band ranging from approximately 500-550 nm.

In the case where the core (PC) of the phosphor (P) absorbs pure blue light and the shell (PS) of the phosphor (P) emits pure red light by controlling a mixed color range of green and red lights, wavelength properties associated with the phosphor (P) are as follows.

The first pure-color wavelength band of the light absorbed by the core (PC) of the phosphor (P) is a blue wavelength band, covering a range of approximately 380-500 nm.

The wavelength band of the light that the core (PC) of the phosphor (P) emits may include a wavelength band of pure red light (hereinafter red wavelength band) which is approximately 600-700 nm, and may include a G-R mixed color wavelength band which is approximately 550-600 nm and ranges from approximately 550-700 nm.

Meanwhile, the specific wavelength band eliminated or attenuated by the shell (PS) of the phosphor (P) may be the G-R mixed color wavelength band and may range from approximately 550-600 nm.

The second pure-color wavelength band of the light emitted from the shell (PS) of the phosphor (P) may be a red wavelength band ranging from approximately 600-700 nm.

In the case where the core (PC) of the phosphor (P) absorbs pure blue light and the shell (PS) of the phosphor (P) emits pure green light by controlling a mixed color range of green and red lights, wavelength properties associated with the phosphor (P) are as follows.

The first pure-color wavelength band of the light absorbed by the core (PC) of the phosphor (P) is a wavelength band of pure blue light (hereinafter referred to as "blue wavelength band"), covering a range of approximately 380-500 nm.

The wavelength band of the light that the core (PC) of the phosphor (P) emits may include a wavelength band of pure green light (hereinafter referred to as "green wavelength band", approximately 500-550 nm) and a wavelength band of green and blue color-mixed light (hereinafter referred to as "B-G mixed color wavelength band", approximately 480-500 nm), ranging from approximately 480-550 nm.

Meanwhile, the specific wavelength band eliminated or attenuated by the shell (PS) of the phosphor (P) may be the B-G mixed color wavelength band and may range from approximately 480-500 nm.

The second pure-color wavelength band of the light emitted from the shell (PS) of the phosphor (P) may be a green wavelength band ranging from approximately 500-550 nm.

The phosphor (P) having the core-shell structure with the core (PC) that may be heavier than the shell (PS) can emit the pure-color light of a pure wavelength band. For example, the weight ratio of the shell (PS) to the core (PC) in the phosphor (P) may be 0.6 or less. The weight of the shell (PS) may be set to be 0.6 or less when the weight of the core (PC) is 1.

The phosphor (P) according to the present invention solves a problem of the phosphor (P) according to related art. The problem of the phosphor (P) according to related art, when the weight ratio of the shell (PS) to the core (PC) in the phosphor (P) is more than 0.6, the plausibility that the shell (PS) emits purer color light is increased. The light emitted from the core (PC) in the phosphor (P) according to related art may penetrate at low efficiency through the shell (PS), resulting in greatly degrading luminance performance.

The phosphor (P) having a core-shell structure according to the present invention with a shell (PS)-to-core (PC) weight ratio of 0.6 or less may allow for the emission of pure color light without degrading luminance performance. In other words, by providing the phosphor (P) with the shell (PS)-to-core (PC) weight ratio of 0.6 or less, the present invention avoids the degrading luminance performance of the phosphor (P) according to related art.

In the phosphor (P) of the present invention having a core-shell structure, the thickness (T) of the shell (PS) may be smaller than the distance (R) from the center (O) of the core (PC) to the surface of the core (PC). For example, the shell (PS), which may range in thickness from 1 nm to 500 μm, may have a thickness of from 2,000 nm-500,000 nm.

Next, FIG. 3 shows various forms of the phosphor (P) having a core-shell structure according to some embodiments of the present invention. A cross section of the phosphor (P) having a core-shell structure according to some embodiments of the present invention may be circular as in the 1st case, polygonal (e.g., triangular, rectangular, and pentagonal) as in the 2nd case, or amorphous as in the 3rd case.

In addition, the phosphor (P) having a core-shell structure according to some embodiments of the present invention may have various cross sectional forms.

From a three-dimensional view point, the phosphor (P) having a core-shell structure according to some embodiments of the present invention may be a sphere, a polyhedron, or an unspecified structure.

Figure 4:
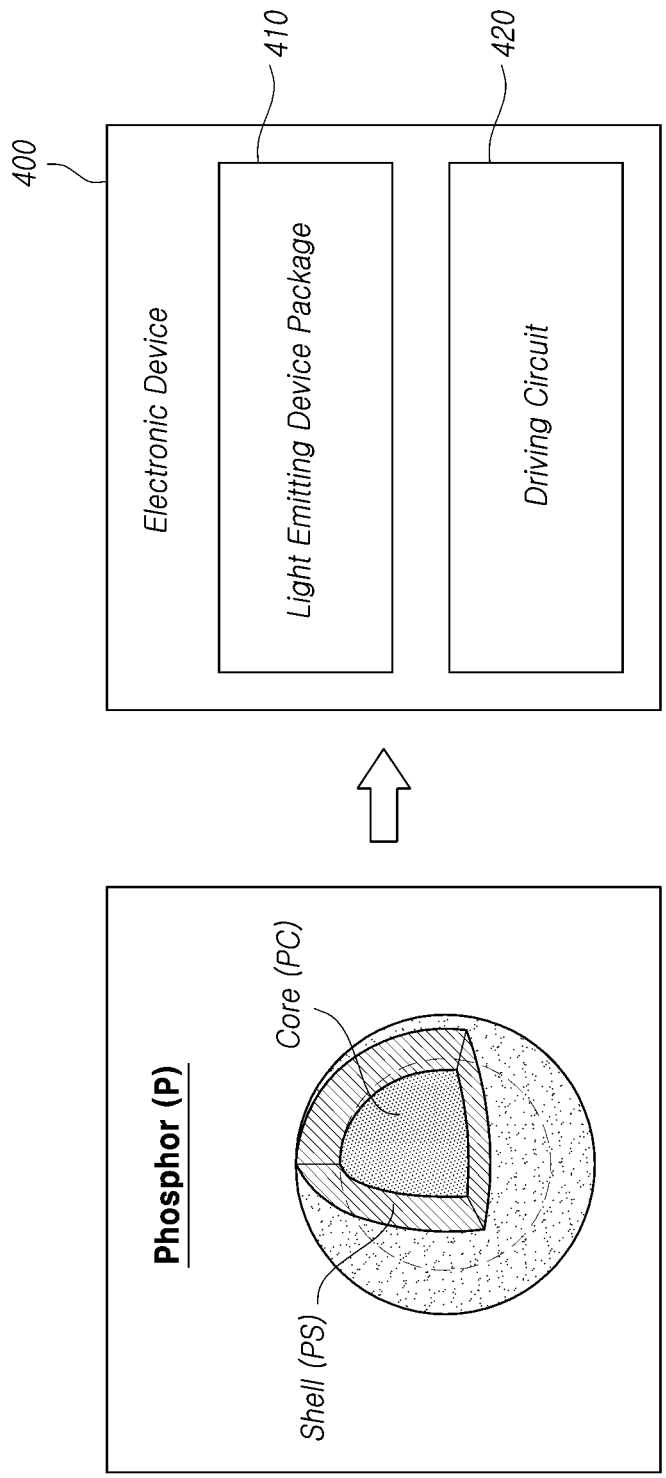
FIG. 4 is a view elucidating the use of the phosphor having a core-shell structure according to some embodiments of the present invention.

Next, FIG. 4 is a view elucidating the use of the phosphor (P) having a core-shell structure according to some embodiments of the present invention. The phosphor (P) having a core-shell structure according to some embodiments of the present invention may find applications in an electronic apparatus 400 comprising a light-emitting device package 410 including at least one light-emitting device, and a driving circuit 420 for driving the at least one light emitting device of the light-emitting device package 410.

The light emitting device included in the light-emitting device package 410 utilizing the phosphor (P) having a core-shell structure according to some embodiments of the present invention, may be, for example, an LED (light emitting diode) chip. The light-emitting device package 410 can include at least one of one or more phosphors which can be, for example, the phosphor (P) having the core-shell structure according to the present invention. A color filter in a display panel of a display apparatus can include a phosphor (P) that has the core-shell structure according to the present invention to enhance the color conversion performance of the color filter, the phosphor (P) positioned being above or below the color filter.

Next, FIG. 5 is a view illustrates three types (e.g., Type 1, Type 2, and Type 3) of a light emitting device packages each utilizing a phosphor (P) having a core-shell structure according to some embodiments of the present invention. The light-emitting device package 410 (refer to FIG. 4) may be of Type 1 inclusive of one kind of light emitting devices and two kinds of phosphors (refer to FIG. 5).

The light-emitting device package 410 of Type 1 includes, for example, the one kind of light emitting device that may be a blue light emitting device emitting blue light while the two kinds of phosphor may be composed of a red phosphor that emits red light and a green phosphor that emits green light.

The light-emitting device package 410 of Type 2 or Type 3 can include, for example, two kinds of light emitting devices and one kind of phosphor (refer to FIG. 5). For the light-emitting device package 410 of Type 2, for example, the two kinds of light emitting devices may be composed of a blue light emitting device that emits blue light and a red light emitting device that emits red light while the one kind of phosphor may be a green phosphor that emits green light. For the light-emitting device package 410 of Type 3, for example, the two kinds of light emitting devices may be composed of a blue light emitting device that emits blue light and a green light emitting device that emits green light while the one kind of phosphor may be a red phosphor that emits red light.

Figure 6:
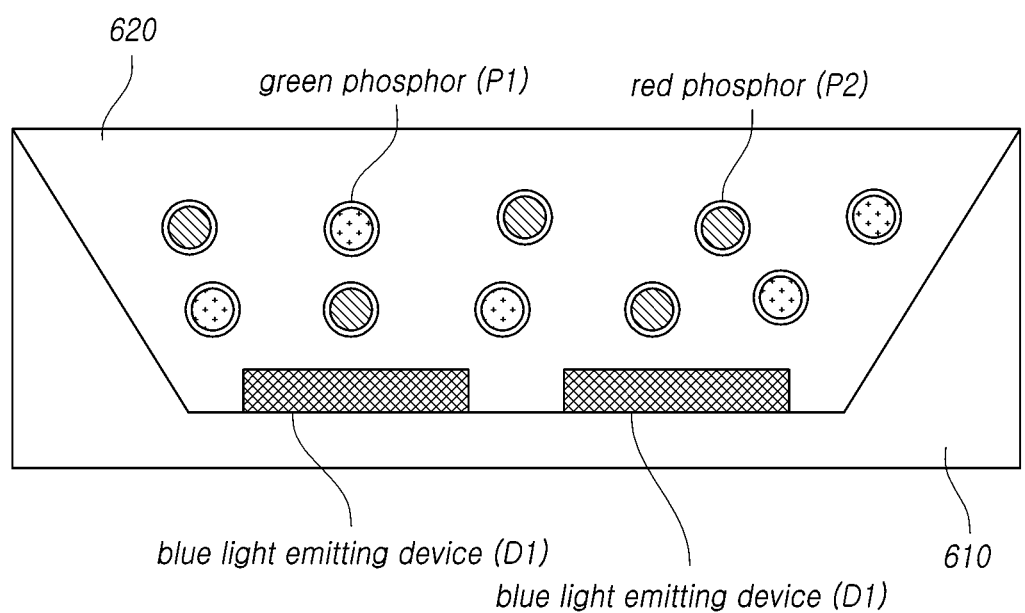
Figure 8:
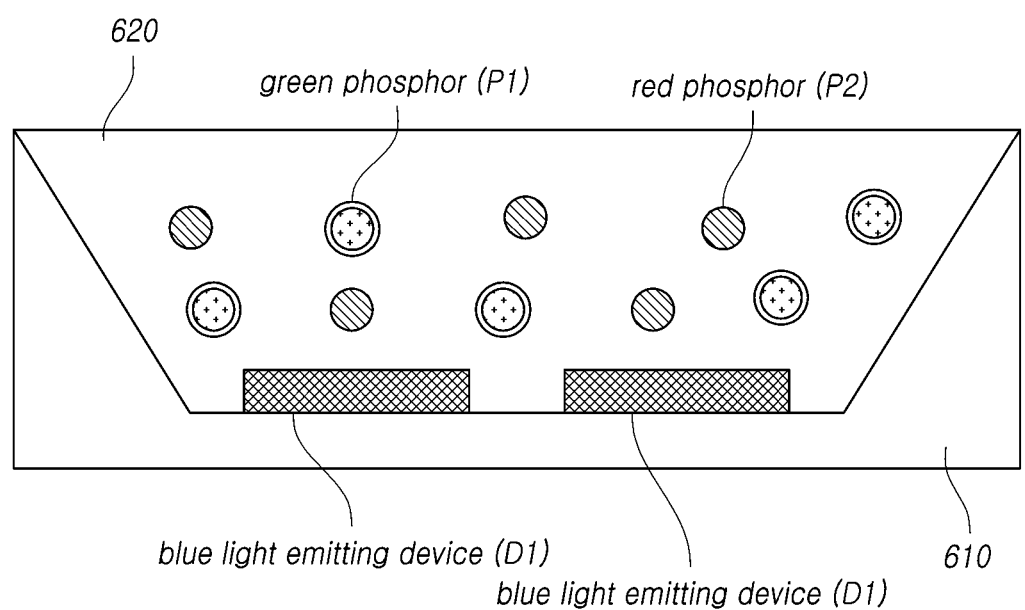
Figure 10:
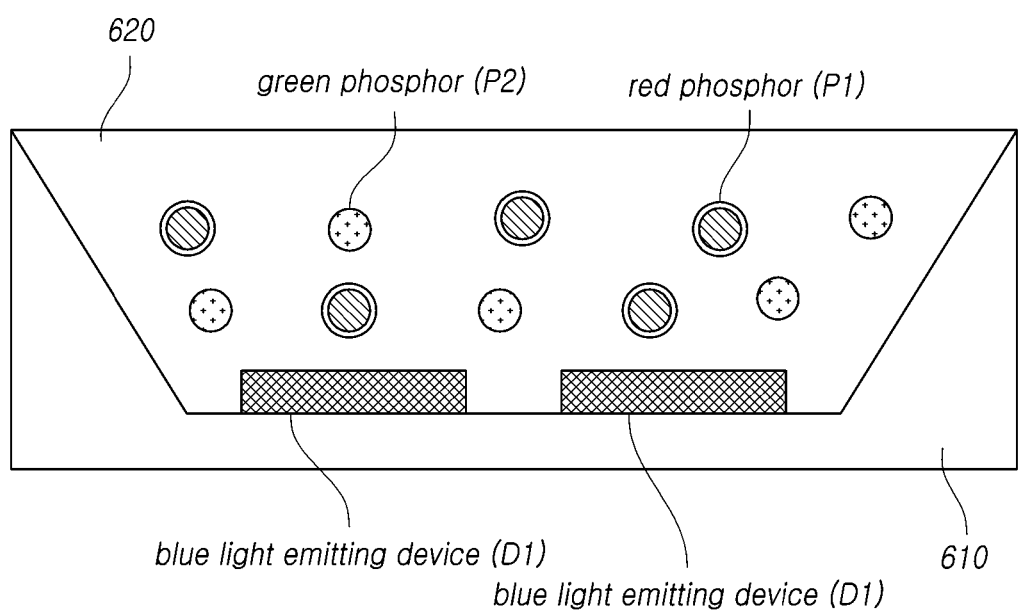

Next, FIGS. 6 and 7 are diagrams respectively illustrating, for example, Type 1-a of the three types of the light-emitting device package 410 (refer to FIGS. 6, 8, and 10). The light-emitting device package 410 of Type 1-a including one kind of light emitting devices (D1) and two kinds of phosphors (P1 and P2), each having a core-shell structure.

Referring to FIG. 6, the light-emitting device package 410 includes a mold 610, one or more first light emitting devices (D1) positioned on the mold 610, and an encapsulant 620 for encapsulating the first light emitting devices (D1). The mold 610 and the encapsulant 620 are structural elements common to all types of the light-emitting device package 410 (refer to FIG. 4). The encapsulant 620 includes a first phosphor (P1) and a second phosphor (P2).

In Type 1-a of the light-emitting device package 410, each of the first light emitting devices (D1) can emit light of a first main wavelength band within the visible light wavelength band. In Type 1-a of the light-emitting device package 410, the first phosphor (P1) and the second phosphor (P2) each have a core-shell structure.

The first phosphor (P1) may include a first core (PC1) which is composed of a fluorescent material emitting light of a first wavelength band different from the first main wavelength band of the light emitted from the first light emitting device (D1), and at least one first shell (PS1) which is applied to the surface of the first core (PC1). The at least one first shell (PS1) applied to the surface of the first core (PC1) eliminates the light of a first specific wavelength band or attenuates the intensity of the light of a first specific wavelength band in the light of a first wavelength band to emit light of a second main wavelength band within the visible light wavelength band.

For example, the first light emitting device (D1) may be a blue light emitting device emitting the first main wavelength band that may be a blue wavelength band of about 380-500 nm.

The first wavelength band of the light that the first core (PC1) of the first phosphor (P1) emits may include a green wavelength band that is about 500-550 nm and may include a G-R mixed color wavelength band, which is about 550-600 nm and ranges from about 500-600 nm.

The first specific wavelength band corresponding to the wavelength band of the light that is attenuated or eliminated by the first shell (PS1) of the first phosphor (P1) may be, for example, a G-R mixed color wavelength band that is about 550-600 nm.

The second main wavelength band corresponding to the wavelength band of the light that is finally emitted from the first shell (PS1) of the first phosphor (P1) may be a green wavelength band that is about 500-550 nm. In other words, the green wavelength band that is about 500-550 nm is emitted from the first phosphor (P1).

The first phosphor (P1) having a core-shell structure included in the light-emitting device package 410 of Type 1-a can emit pure color light of the second main wavelength band.

To emit pure color light of the second main wavelength band by the first phosphor (P1), the first shell (PS1) may be a material having a first light transmission property of attenuating the intensity of the light of a first specific wavelength band, corresponding to the wavelength band of the mixed color light, in the first wavelength band of the light emitted from the first core (PC1). The intensity of the light of a first specific wavelength band is attenuated to less than a threshold intensity (Sth). The attenuated light is output by the first phosphor (P1) after the incidence of light, to emit pure color light of a second main wavelength band.

In the first phosphor (P1), the first core (PC1) may be heavier than the first shell (PS1). For example, the weight ratio of the first shell (PS1) to the first core (PC1) in the first phosphor (P1) may be 0.6 or less.

In the first phosphor (P1), the weight ratio of the first shell (PS1) to the first core (PC1) may be set in such a manner that the intensity attenuation of the light of a first specific wavelength band, corresponding to the wavelength band of the mixed color light, in the first wavelength band of the light emitted from the first core (PC1) is a certain level (K) or greater. In other words, the weight ratio of the first shell (PS1) to the first core (PC1) in the first phosphor (P1) may be designed so that the first core (PC1) is heavier than the first shell (PS1) to emit pure color light without degrading luminance performance.

In the first phosphor (P1), the thickness of the first shell (PS1) may be smaller than the distance (R) from the center (O) of the first core (PC1) to the surface of the first core (PC1). For example, the first shell (PS1) in the first phosphor (P1) may range in thickness from 1 nm-500 μm. More particularly, the first shell (PS1) in the first phosphor (P1) has a thickness of from 2,000 nm-500,000 nm.

In the first phosphor (P1), the thickness of the first shell (PS1) may be determined such that the intensity attenuation of the light of a first specific wavelength band corresponding to the wavelength band of the mixed light in the first wavelength band of the light emitted from the first core (PC1) is a certain level (K) or greater.

The first phosphor (P1) having a core-shell structure with the thickness of the first shell (PS1) being smaller than the distance (R) from the center (O) of the first core (PC1) to the surface of the first core (PC1) is allowed to emit pure color light without degrading luminance performance by designing the thickness of the first shell (PS1).

The first shell (PS1) in the first phosphor (P1) may include at least one rare earth element from the lanthanum group. As used herein, the term "rare earth elements from the lanthanum group" refers to seventeen elements including the fifteen lanthanides (atomic numbers 57-71) plus scandium (Sc) and yttrium (Y).

The fifteen lanthanides include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

As the first shell (PS1) in the first phosphor (P1) includes at least one rare earth element from the lanthanum group, as described above, the light transferred from the first core (PC1) of the first phosphor (P1) can be emitted outside the first shell without loss except the first specific wavelength band of the incident light.

In the first phosphor (P1), the first core (PC1) may include, for example, at least one selected from among (Sr,Ba,Mg)2SiO4:Eu, Al5Lu3O12:Ce, (Sr, Ba,Mg) 2SiO4: Eu, Y3Al5O12:Ce, La3Si6N11:Ce, (Sr,Ba,Eu)2SiO4:Eu, β-Sialon-Si6-zAlzOzN8-z:Eu, Lu3Al5O12:Ce, (Lu, Gd)3Al5O12:Ce, and Y3Al5O12:Ce (0.01<z<10).

According to this material, the first core (PC1) of the first phosphor (P1) may absorb light of a blue wavelength band of about 380-500 nm corresponding to the first main wavelength band of the light emitted from the first light emitting device (D1) so as to emit light of a first wavelength band of about 500-600 nm including a green wavelength band of about 500-550 nm and a G-R mixed color wavelength band of about 550-600 nm.

With reference to FIGS. 6 and 7, the second phosphor (P2) may include a second core (PC2) which is composed of a fluorescent material emitting light of a second wavelength band different from the first main wavelength band of the light emitted from the first light emitting device (D1), and at least one second shell (PS2) (refer to FIGS. 6 and 7). The at least one second shell (PS2) is applied to the surface of the second core (PC2) and eliminates the light of a second specific wavelength band or attenuates the intensity of the light of a second specific wavelength band in the light of a second wavelength band to emit light of a third main wavelength band within the visible light wavelength band.

Having a core-shell structure with a second core (PC2) composed of a fluorescent material emitting light of a second wavelength band different from the first main wavelength band of the light emitted from the first light emitting device (D1), the second phosphor (P2) can emit the pure color light of a third main wavelength band different from both the first main wavelength band of the pure color light emitted form the first light emitting device (D1) and the second main wavelength band of the light emitted from the first phosphor (P1).

For example, the first light emitting device (D1) may be a blue light emitting device, and when the first main wavelength band is a blue wavelength band of about 380-500 nm, the second wavelength band of the light that the second core (PC2) of the second phosphor (P2) emits may include a red wavelength band of about 600-700 nm and a G-R mixed color wavelength band of about 550-600 nm, covering a range of about 550-700 nm.

The second specific wavelength band which corresponds to the wavelength band of the light attenuated or eliminated by the second shell (PS2) of the second phosphor (P2) may be, for example, a G-R mixed color wavelength band of about 550-600 nm.

The third main wavelength band which corresponds to the wavelength band of the light finally emitted from the second shell (PS2) of the second phosphor (P2), that is, from the second phosphor (P2), may be a red wavelength band of about 600-700 nm.

In the second phosphor (P2), the second shell (PS2) may be a material having a second light transmission property of attenuating the intensity of the light of a second specific wavelength band, corresponding to the wavelength band of the mixed color light, in the second wavelength band of the light emitted from the second core (PC2) to less than a threshold intensity (Sth) and outputting the attenuated light after the incidence of light.

Accordingly, the second phosphor (P2) may emit pure color light of a third main wavelength band by reducing the intensity of the light of the second specific wavelength band corresponding to the mixed color wavelength band.

In the second phosphor (P2), the second core (PC2) may be heavier than the second shell (PS2).

For example, the weight ratio of the second shell (PS2) to the second core (PC2) in the second phosphor (P2) may be 0.6 or less.

In the second phosphor (P2), the weight ratio of the second shell (PS2) to the second core (PC2) may be set in such a manner that the intensity attenuation of the light of a second specific wavelength band, corresponding to the wavelength band of the mixed color light, in the second wavelength band of the light emitted from the second core (PC2) is a certain level (K) or greater.

In a second phosphor (P2) having a core-shell structure, as mentioned above, a weight ratio of a second shell (PS2) to a second core (PC2) may be designed so as to emit pure color light without degrading luminance performance.

In the second phosphor (P2), the thickness of the second shell (PS2) may be smaller than the distance (R) from the center (O) of the second core (PC2) to the surface of the second core (PC2). For example, the second shell (PS2) in the second phosphor (P2) may range in thickness from 1 nm-500 μm.

More particularly, the second shell (PS2) in the second phosphor (P2) has a thickness of from 2,000 nm-500,000 nm.

In the second phosphor (P2), the thickness of the second shell (PS2) may be determined such that the intensity attenuation of the light of a second specific wavelength band corresponding to the wavelength band of the mixed light in the second wavelength band of the light emitted from the second core (PC2) is a certain level (K) or greater.

The second phosphor (P2) having a core-shell structure with the thickness of the second shell (PS2) being smaller than the distance (R) from the center (O) of the second core (PC2) to the surface of the second core (PC2) is allowed to emit pure color light without degrading luminance performance by designing the thickness of the second shell (PS2).

The second shell (PS2) in the second phosphor (P2) may include at least one rare earth element from the lanthanum group. As used herein, the term "rare earth elements from the lanthanum group" refers to seventeen elements including the fifteen lanthanides (atomic numbers 57-71) plus scandium (Sc) and yttrium (Y).

The fifteen lanthanides include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

As the second shell (PS2) in the second phosphor (P2) includes at least one rare earth element from the lanthanum group, and as described above, the light transferred from the second core (PC2) of the second phosphor (P2) can be emitted outside the second shell without loss except the second specific wavelength band of the incident light.

In the second phosphor (P2), the second core (PC2) may include, for example, at least one selected from among (Sr,Ba,Mg)3SiO5:Eu, (Sr,Ca)AlSiN3:Eu, CaAlSiN3:Eu, MyM'z(Si,B,Al)5OxN8-x:Eu, MSi1-zA2zOzN2-z:Eu, α-Sialon:CaxEuy(Si,Al)12(O,N)16, and S-CaAlSiN, CaAlSiN, (Sr,Ca)AlSiN3:Eu, K2SiF6:Mn4+ (0.01<x<10, 0.01<y<20, 0.01<z<10, M and M' may each be selected from among Ca, Sr, and Ba).

According to this material, the second core (PC2) of the second phosphor (P2) may absorb light of a blue wavelength band of about 380-500 nm corresponding to the first main wavelength band of the light emitted from the first light emitting device (D1) so as to emit light of a second wavelength band of about 550-700 nm including a red wavelength band of about 600-700 nm and a G-R mixed color wavelength band of about 550-600 nm.

In the light-emitting device package 410 of Type 1-a, the first specific wavelength band, which is the wavelength band of the light eliminated or attenuated by the first shell (PS1) of the first phosphor (P1) may be identical to or overlap with the second specific wavelength band, which is the wavelength band of the light eliminated or attenuated by the second shell (PS2) of the second phosphor (P2).

In the light-emitting device package 410 of Type 1-a, if necessary, the first specific wavelength band, which is the wavelength band of the light eliminated or attenuated by the first shell (PS1) of the first phosphor (P1) may be different from the second specific wavelength band, which is the wavelength band of the light eliminated or attenuated by the second shell (PS2) of the second phosphor (P2), without overlap therebetween.

As indicated by the design for a wavelength band to be attenuated or eliminated, the light transmission properties in each of the first shell (PS1) of the first phosphor (P1) and the second shell (PS2) of the second phosphor (P2) can be controlled depending on the presence or absence of a B-G mixed color wavelength band between a blue wavelength band and a green wavelength band and a G-R mixed color wavelength band between a green wavelength band and a red wavelength band, and a degree of color mixing. Through the control, improvement can be made of entire color reproduction capability in the light-emitting device package 410.

The weight ratio of the first shell (PS1) to the first core (PC1) in the first phosphor (P1) may be identical to or different from that of the second shell (PS2) to the second core (PS2) in the second phosphor (P2).

As indicated by the aforementioned design for the weight ratio, the light transmission properties in each of the first shell (PS1) of the first phosphor (P1) and the second shell (PS2) of the second phosphor (P2) can be controlled depending on the presence or absence of a B-G mixed color wavelength band between a blue wavelength band and a green wavelength band, and a G-R mixed color wavelength band between a green wavelength band and a red wavelength band, and a degree of color mixing. Through the control, improvement can be made of entire color reproduction capability in the light-emitting device package 410.

The thickness of the first shell (PS1) in the first phosphor (P1) may be identical to or different from that of the second shell (PS2) in the second phosphor (P2).

As indicated by the design for the shell thicknesses, the light transmission properties in each of the first shell (PS1) of the first phosphor (P1) and the second shell (PS2) of the second phosphor (P2) can be controlled depending on the presence or absence of a B-G mixed color wavelength band between a blue wavelength band and a green wavelength band, and a G-R mixed color wavelength band between a green wavelength band and a red wavelength band, and a degree of color mixing. Through the control, improvement can be made of entire color reproduction capability in the light-emitting device package 410.

In a case where a mixed color wavelength band relating to the second wavelength band of the light emitted from the second core (PC2) of the second phosphor (P2) has greater influence on pure color reproduction, the second shell (PS2) of the second phosphor (P1) may be designed to be thicker than the first shell (PS1) of the first phosphor (P1), for example.

When a mixed color wavelength band relating to the second wavelength band of the light emitted from the second core (PC2) of the second phosphor (P2) has greater influence on pure color reproduction, such designing makes it possible to more effectively eliminate the light of the second specific wavelength from the light emitted from the second core (PC2) of the second phosphor (P2), thereby improving pure color reproduction capability in the light-emitting device package 410.

Next, FIGS. 8 and 9 are diagrams respectively showing a light-emitting device package of Type 1-b including one kind of light emitting device (e.g., blue light emitting device) and two kinds of phosphors (green phosphors (P1) and red phosphors (P2)), and a green phosphor (P1) having a core-shell structure and a red phosphor (P2) having a structure according to the present application.

The light-emitting device package 410 of Type 1-b may comprise a first light emitting device (D1) emitting the light of a first main wavelength band within the visible wavelength band.

The light-emitting device package 410 of Type 1-b may comprise a first phosphor (P1) and a second phosphor (P2).

The first phosphor (P1) may have a core-shell structure.

The second phosphor (P2) has a structure according to related art consisting of a core alone, without shells. That is, the second phosphor (P2) does not have a core-shell structure.

The first phosphor (P1) may include a first core (PC1) which is composed of a fluorescent material emitting light of a first wavelength band different from the first main wavelength band of the light emitted from the first light emitting device (D1), and at least one first shell (PS1) which is applied to the surface of the first core (PC1) and which eliminates the light of a first specific wavelength band or attenuates the intensity of the light of a first specific wavelength band in the light of a first wavelength band to emit light of a second main wavelength band within the visible light wavelength band.

For example, the first light emitting device (D1) may be a blue light emitting device and the first main wavelength band may be a blue wavelength band of about 380-500 nm.

The first wavelength band of the light that the first core (PC1) in the first phosphor (P1) emits may include a green wavelength band of about 500-550 nm and a G-R mixed color wavelength band, which is about 550-600 nm and covers a range from about 500-600 nm.

The first specific wavelength band corresponding to the wavelength band of the light that is attenuated or eliminated by the first shell (PS1) of the first phosphor (P1) may be, for example, a G-R mixed color wavelength band of about 550-600 nm.

The second main wavelength band corresponding to the wavelength band of the light that is finally emitted from the first shell (PS1) of the first phosphor (P1), that is, from the first phosphor (P1) may be a green wavelength band of about 500-550 nm.

Having a core-shell structure, as described above, the first phosphor (P1) can emit pure color light of the second main wavelength band.

In the first phosphor (P1), the first shell (PS1) may be a material having a first light transmission property of attenuating the intensity of the light of a first specific wavelength band, corresponding to the wavelength band of the mixed color light, in the first wavelength band of the light emitted from the first core (PC1) to less than a threshold intensity (Sth) and outputting the attenuated light after the incidence of light.

Accordingly, the first phosphor (P1) may emit pure color light of a second main wavelength band by reducing the intensity of the light of the first specific wavelength band corresponding to the mixed color wavelength band.

In the first phosphor (P1), the weight ratio of the first shell (PS1) to the first core (PC1) may be 0.6 or less. In order words, the weight of the shell (PS1) may be set to be 0.6 or less in the first phosphor (P1) when the weight of the first core (PC1) is 1.

In the first phosphor (P1), the weight ratio of the first shell (PS1) to the first core (PC1) may be set in such a manner that the intensity attenuation of the light of a first specific wavelength band, corresponding to the wavelength band of the mixed color light, in the first wavelength band of the light emitted from the first core (PC1) is a certain level (K) or greater.

In a first phosphor (P1) having a core-shell structure, as mentioned above, a weight ratio of a first shell (PS1) to a first core (PC1) may be designed so as to emit pure color light without degrading luminance performance.

In the first phosphor (P1), the first shell (PS1) may range in thickness from 1 nm-500 μm.

More particularly, the first shell (PS1) in the first phosphor (P1) has a thickness of from 2,000 nm-500,000 nm.

In the first phosphor (P1), the thickness of the first shell (PS1) may be determined such that the intensity attenuation of the light of a first specific wavelength band corresponding to the wavelength band of the mixed color light in the first wavelength band of the light emitted from the first core (PC1) is a certain level (K) or greater.

As described above, designing the thickness of the first shell (PS1) in the first phosphor (P1) having a core-shell structure, that is, designing the thickness of the first shell (PS1) wrapping the first core (PC1) in consideration of the size of the first core (PC1) allows the emission of pure color light without degrading luminance performance.

The first shell (PS1) in the first phosphor (P1) may include at least one rare earth element from the lanthanum group.

As used herein, the term "rare earth elements from the lanthanum group" refers to seventeen elements including the fifteen lanthanides (atomic numbers 57-71) plus scandium (Sc) and yttrium (Y).

The fifteen lanthanides include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

As the first shell (PS1) in the first phosphor (P1) includes at least one rare earth element from the lanthanum group, as described above, the light transferred from the first core (PC1) of the first phosphor (P1) can be emitted outside the first shell without loss except the first specific wavelength band of the incident light.

In the first phosphor (P1), the first core (PC1) may include, for example, at least one selected from among $(Sr,Ba,Mg)_2SiO_4:Eu$, $Al_5Lu_3O_{12}:Ce$, $(Sr,Ba,Mg)_2SiO_4:Eu$, $Y_3Al_5O_{12}:Ce$, $La_3Si_6N_{11}:Ce$, $(Sr,Ba,Eu)_2SiO_4:Eu$, $\beta$-Sialon:$S_{16-z}Al_zO_zN_{8-z}:Eu$, $Lu_3Al_5O_{12}:Ce$, $(Lu,Gd)_3Al_5O_{12}:Ce$, and $Y_3Al_5O_{12}:Ce$ ($0.01<z<10$).

According to this material, the first core (PC1) of the first phosphor (P1) may absorb light of a blue wavelength band of about 380-500 nm corresponding to the first main wavelength band of the light emitted from the first light emitting device (D1) so as to emit light of a first wavelength band of about 500-600 nm including a green wavelength band of about 500-550 nm and a G-R mixed color wavelength band of about 550-600 nm.

With reference to FIGS. 8 and 9, the second phosphor (P2) may include a second core (PC2) which is composed of a fluorescent material emitting light of a second wavelength band different from the first main wavelength band of the light emitted from the first light emitting device (D1), but a shell applied to the surface of the second core (PC2) does not exist.

The second core (PC2) in the second phosphor (P2) may emit light of a second wavelength band covering a red wavelength band alone or plus a G-R mixed color wavelength band.

A G-R mixed color wavelength, although existing in the light emitted from the second core (PC2) of the second phosphor (P2), can be reduced or eliminated by the first shell (PS1) of the first phosphor (P1).

Of the two phosphors (P1 and P2), as described above, only the first phosphor (P1), which corresponds to a green phosphor, is of a core-shell structure while the second phosphor (P2), which corresponds to a red phosphor, has a structure according to related art including a core alone. If the light-emitting device package 410 improves in entire pure color reproduction capability, it unnecessary to make both phosphors (P1 and P2) have a core-shell structure. In this regard the production cost and process complexity of the phosphor can be reduced.

Next, FIGS. 10 and 11 are diagrams respectively showing a light-emitting device package of Type 1-c including one kind of light emitting device (blue light emitting device) and two kinds of phosphors (red phosphors (P1) and green phosphors (P2)), and a red phosphor (P1) having a core-shell structure and a green phosphor (P2) having a structure according to the present application.

The light-emitting device package 410 of Type 1-c may comprise a first light emitting device (D1) emitting the light of a first main wavelength band within the visible wavelength band.

The light-emitting device package 410 of Type 1-c may comprise a first phosphor (P1) and a second phosphor (P2).

The first phosphor (P1) may have a core-shell structure.

The second phosphor (P2) has a structure according to related art consisting of a core alone, without shells. That is, the second phosphor (P2) does not have a core-shell structure.

The first phosphor (P1) may include a first core (PC1) which is composed of a fluorescent material emitting the light of a first wavelength band different from the first main wavelength band of the light emitted from the first light emitting device (D1), and at least one first shell (PS1) which is applied to the surface of the first core (PC1) and which eliminates the light of a first specific wavelength band or attenuates the intensity of the light of a first specific wavelength band in the light of a first wavelength band to emit the light of a second main wavelength band within the visible light wavelength band.

For example, the first light emitting device (D1) may be a blue light emitting device and the first main wavelength band may be a blue wavelength band of about 380-500 nm.

The first wavelength band of the light emitted by the first core (PC1) in the first phosphor (P1), which is a red phosphor, may include a red wavelength band about 600-700 nm and a G-R mixed color wavelength band, which is about 550-600 nm and covers a range of from about 550-700 nm.

The first specific wavelength band corresponding to the wavelength band of the light that is attenuated or eliminated by the first shell (PS1) of the first phosphor (P1) may be, for example, a G-R mixed color wavelength band about 600-700 nm.

The second main wavelength band corresponding to the wavelength band of the light that is finally emitted from the first shell (PS1) of the first phosphor (P1), that is, from the first phosphor (P1) may be a red wavelength band of about 600-700 nm.

Having a core-shell structure, as described above, the first phosphor (P1) can emit pure color light of the second main wavelength band.

In the first phosphor (P1), the first shell (PS1) may be a material having a first light transmission property of attenuating the intensity of the light of a first specific wavelength band, corresponding to the wavelength band of the mixed color light, in the first wavelength band of the light emitted from the first core (PC1) to less than a thershold intensity (Sth) and outputting the attenuated light after the incidence of light. Accordingly, the first phosphor (P1) may emit pure color light of a second main wavelength band.

In the first phosphor (P1), the weight ratio of the first shell (PS1) to the first core (PC1) may be 0.6 or less. In the first phosphor (P1), the weight ratio of the first shell (PS1) to the first core (PC1) may be set in such a manner that the intensity attenuation of the light of a first specific wavelength band, corresponding to the wavelength band of the mixed color light, in the first wavelength band of the light emitted from the first core (PC1) is a certain level (K) or greater.

In a first phosphor (P1) having a core-shell structure, as mentioned above, a weight ratio of a first shell (PS1) to a first core (PC1) may be designed so as to emit pure color light without degrading luminance performance.

In the first phosphor (P1), the first shell (PS1) may range in thickness from 1 nm-500 μm.

More particularly, the first shell (PS1) in the first phosphor (P1) has a thickness of from 2,000 nm-500,000 nm.

In the first phosphor (P1), the thickness of the first shell (PS1) may be determined such that the intensity attenuation of the light of a first specific wavelength band corresponding to the wavelength band of the mixed color light in the first wavelength band of the light emitted from the first core (PC1) is a certain level (K) or greater. The first shell (PS1) that is included in the first phosphor (P1) with a core-shell structure has the thickness wrapping the first core (PC1) to allow the emission of pure color light without degrading luminance performance.

The first shell (PS1) in the first phosphor (P1) may include at least one rare earth element from the lanthanum group.

As used herein, the term "rare earth elements from the lanthanum group" refers to seventeen elements including the fifteen lanthanides (atomic numbers 57-71) plus scandium (Sc) and yttrium (Y).

The fifteen lanthanides include La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

As the first shell (PS1) in the first phosphor (P1) includes at least one rare earth element from the lanthanum group, as described above, the light transferred from the first core (PC1) of the first phosphor (P1) can be emitted outside the first shell without loss except the first specific wavelength band of the incident light.

In the first phosphor (P1), the first core (PC1) may include, for example, at least one selected from among $(Sr,Ba,Mg)_2SiO_4:Eu$, $Al_5Lu_3O_2:Ce$, $(Sr,Ba,Mg)_2SiO_4:Eu$, $Y_3Al_5O_{12}:Ce$, $La_3Si_6N_{11}:Ce$, $(Sr,Ba,Eu)_2SiO_4:Eu$, β-Sialon:$Si_{6-z}Al_zO_zN_{8-z}:Eu$, $Lu_3Al_5O_{12}:Ce$, $(Lu,Gd)_3Al_5O_{12}:Ce$, and $Y_3Al_5O_{12}:Ce$ ($0.01<z<10$).

According to this material, the first core (PC1) of the first phosphor (P1) may absorb light of a blue wavelength band of about 380-500 nm corresponding to the first main wavelength band of the light emitted from the first light emitting device (D1) so as to emit light of a first wavelength band of about 500-600 nm including a green wavelength band of about 500-550 nm and a G-R mixed color wavelength band of about 550-600 nm.

The second phosphor (P2) may include a second core (PC2) which is composed of a fluorescent material emitting light of a second wavelength band different from the first main wavelength band of the light emitted from the first light emitting device (D1), but a shell wrapping the second core (PC2) does not exist.

The second core (PC2) in the second phosphor (P2) may emit light of a second wavelength band covering a green wavelength band alone or plus a G-R (B-G) mixed color wavelength band.

A G-R mixed color wavelength, although existing in the light emitted from the second core (PC2) of the second phosphor (P2), can be reduced or eliminated by the first shell (PS1) of the first phosphor (P1).

Of the two phosphors (P1 and P2), as described above, only the first phsophor (P1), which corresponds to a red phosphor, is of a core-shell structure while the second phosphor (P2), which corresponds to a green phosphor, has a general structure. If the light-emitting device package 410 improves in entire pure color reproduction capability, it is unnecessary to make both phosphors (P1 and P2) have a core-shell structure. In this regard the production cost and process complexity of the phosphor can be reduced.

Figure 12:
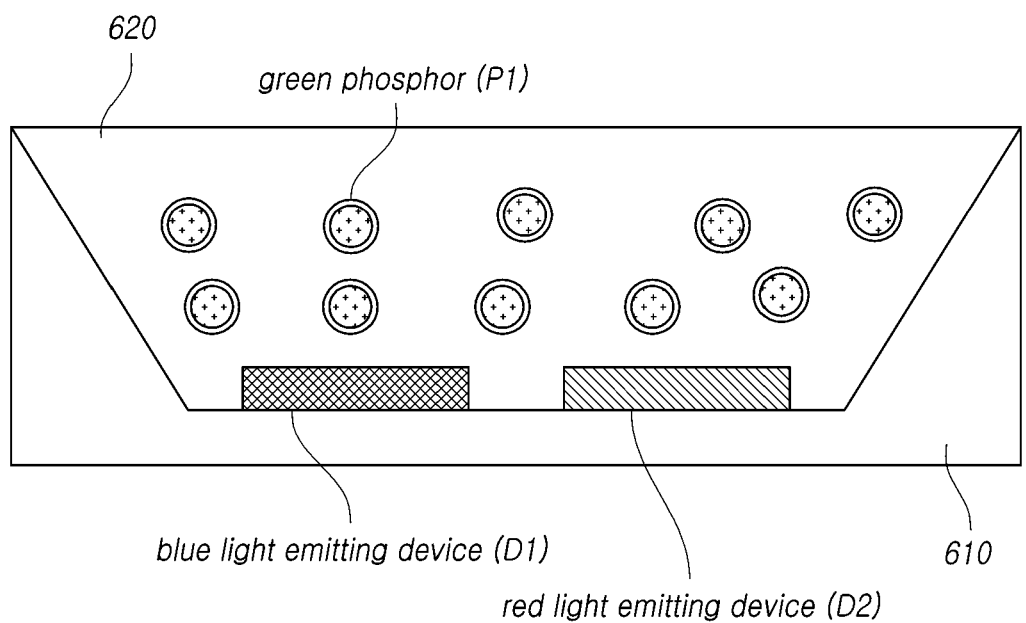
FIGS. 12 and 13 are diagrams respectively showing a light-emitting device package of Type 2 including two kinds of light emitting devices (blue light emitting device and red light emitting device) and one kind of phosphor (green phosphor), and a green phosphor having a core-shell structure.
Figure 13:
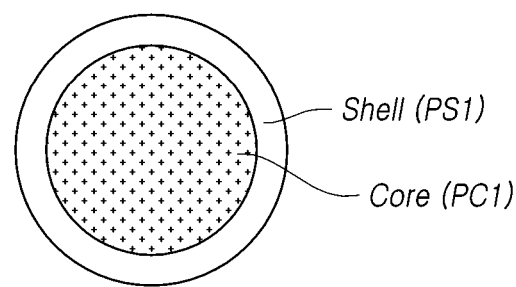

Next, FIGS. 12 and 13 are diagrams respectively showing a light-emitting device package of Type 2 including two kinds of light emitting devices (blue light emitting device and red light emitting device) and one kind of phosphors (e.g., a green phosphor), and a green phosphor having a core-shell structure.

The light-emitting device package 410 may comprise a first light emitting device (D1) and a second light emitting device (D2) which emit the light of a first main wavelength band (blue wavelength band) and a third main wavelength band (e.g., a red wavelength band), respectively, within the visible light wavelength band.

For example, the first light emitting device (D1) may be a blue light emitting device and the first main wavelength band may be a blue wavelength band of about 380-500 nm. The second light emitting device (D2) may be a red light emitting device, and the third main wavelength band may be a red wavelength band of about 600-700 nm.

The light-emitting device package 410 of Type 2 may include a first phosphor (P1), corresponding to a green phosphor, having a core-shell structure.

The first phosphor (P1) may include a first core (PC1) which is composed of a fluorescent material emitting the light of a first wavelength band different from the first main wavelength band of the light emitted from the first light emitting device (D1), and at least one first shell (PS1) which is applied to the surface of the first core (PC1) and which eliminates the light of a first specific wavelength band or attenuate the intensity of the light of a first specific wavelength band in the light of a first wavelength band to emit light of a second main wavelength band within the visible light wavelength band.

For example, the first wavelength band of the light that the first core (PC1) of the first phosphor (P1) emits may include a green wavelength band of about 500-550 nm and a G-R mixed color wavelength band, which is about 550-600 nm and covers a range from about 500-600 nm.

The first specific wavelength band corresponding to the wavelength band of the light that is attenuated or eliminated by the first shell (PS1) of the first phosphor (P1) may be, for example, a G-R mixed color wavelength band of about 550-600 nm.

The second main wavelength band corresponding to the wavelength band of the light that is finally emitted from the first shell (PS1) of the first phosphor (P1), that is, from the first phosphor (P1) may be a green wavelength band of about 500-550 nm.

In another embodiment, the first wavelength band of the light emitted by the first core (PC1) of the first phosphor (P1) may include a green wavelength band of about 500-550 nm and a B-G mixed color wavelength band of about 480-500 nm, covering a range of about 480-550 nm.

The first specific wavelength band corresponding to the wavelength band of the light attenuated or eliminated by the first shell (PS1) of the first phosphor (P1) may be a B-G mixed color wavelength band of about 480-500 nm.

The second main wavelength band corresponding to the wavelength band of the light finally emitted from the first shell (PS1) of the first phosphor (P1), that is, from the first phosphor (P1), may be a green wavelength band of about 500-550 nm. Two colors (e.g., blue and red) out of three colors (e.g., red, green, and blue) may be expressed by pure color light using the two light emitting devices (D1 and D2) while the other color (e.g., green) may be expressed by pure color light using the first phosphor (P1) having a core-shell structure.

Figure 14:
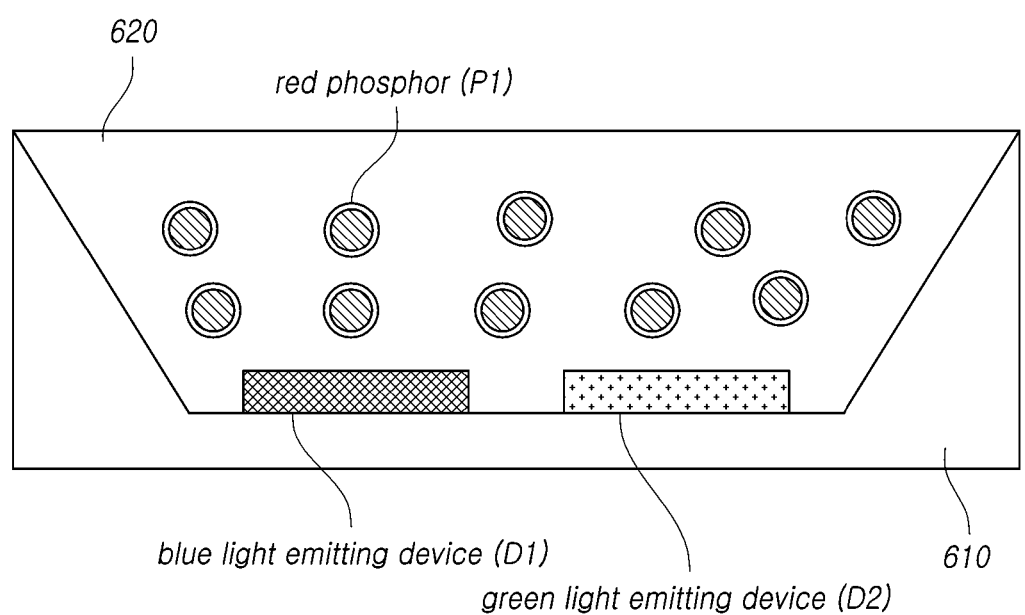
FIGS. 14 and 15 are diagrams respectively showing a light-emitting device package of Type 3 including two kinds of light emitting devices (blue light emitting device and green light emitting devices) and one kind of phosphor (red phosphor), and a red phosphor having a core-shell structure.
Figure 15:
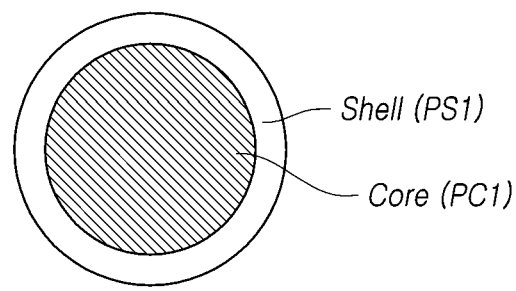

Next, FIGS. 14 and 15 are diagrams respectively showing a light-emitting device package of Type 3 including two kinds of light emitting devices (e.g., a blue light emitting device and a green light emitting device) and one kind of phosphor (e.g., a red phosphor), having a core-shell structure.

The light-emitting device package 410 of Type 3 may comprise a first light emitting device (D1) and a second light emitting device (D2) which emit the light of a first main wavelength band (blue wavelength band) and a third main wavelength band (e.g., a green wavelength band), respectively, within the visible light wavelength band.

For example, the first light emitting device (D1) may be a blue light emitting device and the first main wavelength band may be a blue wavelength band of about 380-500 nm. The second light emitting device (D2) may be a green light emitting device, and the third main wavelength band may be a green wavelength band of about 500-550 nm.

The light-emitting device package 410 of Type 3 may include a first phosphor (P1), corresponding to a red phosphor, having a core-shell structure. The first phosphor (P1) may include a first core (PC1) which is composed of a fluorescent material emitting the light of a first wavelength band different from the first main wavelength band of the light emitted from the first light emitting device (D1), and at least one first shell (PS1) which is applied to the surface of the first core (PC1) and which eliminates the light of a first specific wavelength band or attenuates the intensity of the light of a first specific wavelength band in the light of a first wavelength band to emit light of a second main wavelength band within the visible light wavelength band.

For example, the first wavelength band of the light that the first core (PC1) of the first phosphor (P1), which is a red phosphor, emits may include a red wavelength band of about 600-700 nm and a G-R mixed color wavelength band of about 550-600 nm, covering a range of from about 550-700 nm.

The first specific wavelength band corresponding to the wavelength band of the light that is attenuated or eliminated by the first shell (PS1) of the first phosphor (P1) may be, for example, a G-R mixed color wavelength band of about 550-600 nm.

The second main wavelength band corresponding to the wavelength band of the light that is finally emitted from the first shell (PS1) of the first phosphor (P1), may be a red wavelength band of about 600-700 nm.

Two colors (e.g., blue and green), of red, green, and blue colors, may be expressed as pure color light using the two light emitting devices (D1 and D2) while the other color (e.g., red) may be expressed as pure color light using the first phosphor (P1) having a core-shell structure.

Figure 16:
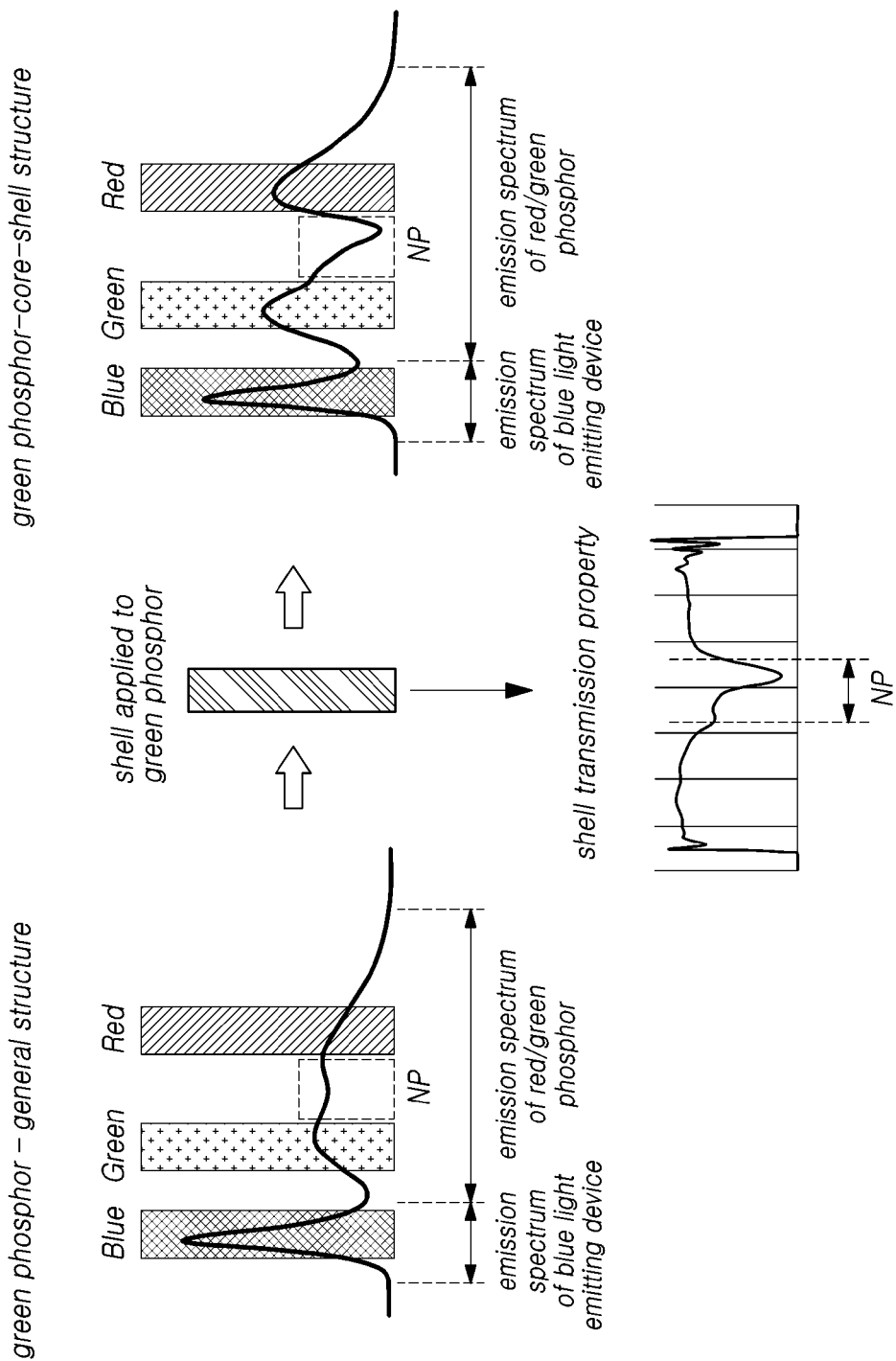
FIG. 16 shows emission spectra of a light-emitting device package in which the gamut of pure colors is improved as the core-shell structure of the green phosphor eliminates a green-red (G-R) mixed color noise in accordance with some embodiment of the present invention.

Next, FIG. 16 shows emission spectra of the light-emitting device package 410 in which the gamut of pure colors is improved as the core-shell structure of the green phosphor eliminates a G-R mixed color noise in accordance with some embodiments of the present invention.

In the case of the light emitting device packages 410 of Types 1-a and 1-b (e.g., white light emitting device packages using blue light emitting devices, and red and green phosphors), a comparison is made of emission spectra between a light emitting device package in which the green phosphor has a structure according to related art lacking a shell and a light emitting device package 410 according to some embodiments of the present invention in which the green phosphor has a core-shell structure provided with a shell (refer to FIG. 16).

For a green phosphor having a structure according to related art consisting of a core without a shell, the emission spectrum shows the mixing of green and red colors because the intensity of the light in the green-red (G-R) mixed color wavelength band (NP) is similar to the intensity of the light in the pure green wavelength band and in the pure red wavelength band, without a significant difference therebetween.

As a result of the intensity of the light in the G-R mixed color wavelength band (NP) being similar to the intensity of the light in the pure green wavelength band and in the pure red wavelength band, the light-emitting device package according to related art has a problem in that it cannot reproduce pure colors with a decrease in the emission performance of white light. A display apparatus or illumination apparatus employing the light-emitting device package according to related art has inferior color reproduction capability.

For a green phosphor having a core-shell structure provided with a shell according to the light-emitting device package of the present application, the shell of the green phosphor absorbs the light of a G-R mixed color wavelength band (NP) from the light emitted by the core of the green phosphor to emit pure or substantially pure green color light that is completely or mostly free of the light of the G-R mixed color wavelength band (NP).

As can be seen in the emission spectrum of the green phosphor having a core-shell structure provided with a shell, the intensity of light in a G-R mixed color wavelength band (NP) is greatly lower than light in a pure green wavelength band and in a pure red green wavelength band, so that the mixing of green and red colors is completely or substantially removed.

As a result, the light-emitting device package 410 according to some embodiments of the present invention can reproduce pure colors with the consequent increase of the emission performance of white light. An electronic apparatus 400, such as a display apparatus or illumination apparatus employing the light-emitting device package 410, may greatly improve in color reproduction capability.

Meanwhile, a higher content of the green phosphors having a core-shell structure in the encapsulant 620 allows the light finally emitted by the green phosphors to appear at a higher intensity in the emission spectrum, thereby further increasing the gamut of pure colors.

Figure 17:
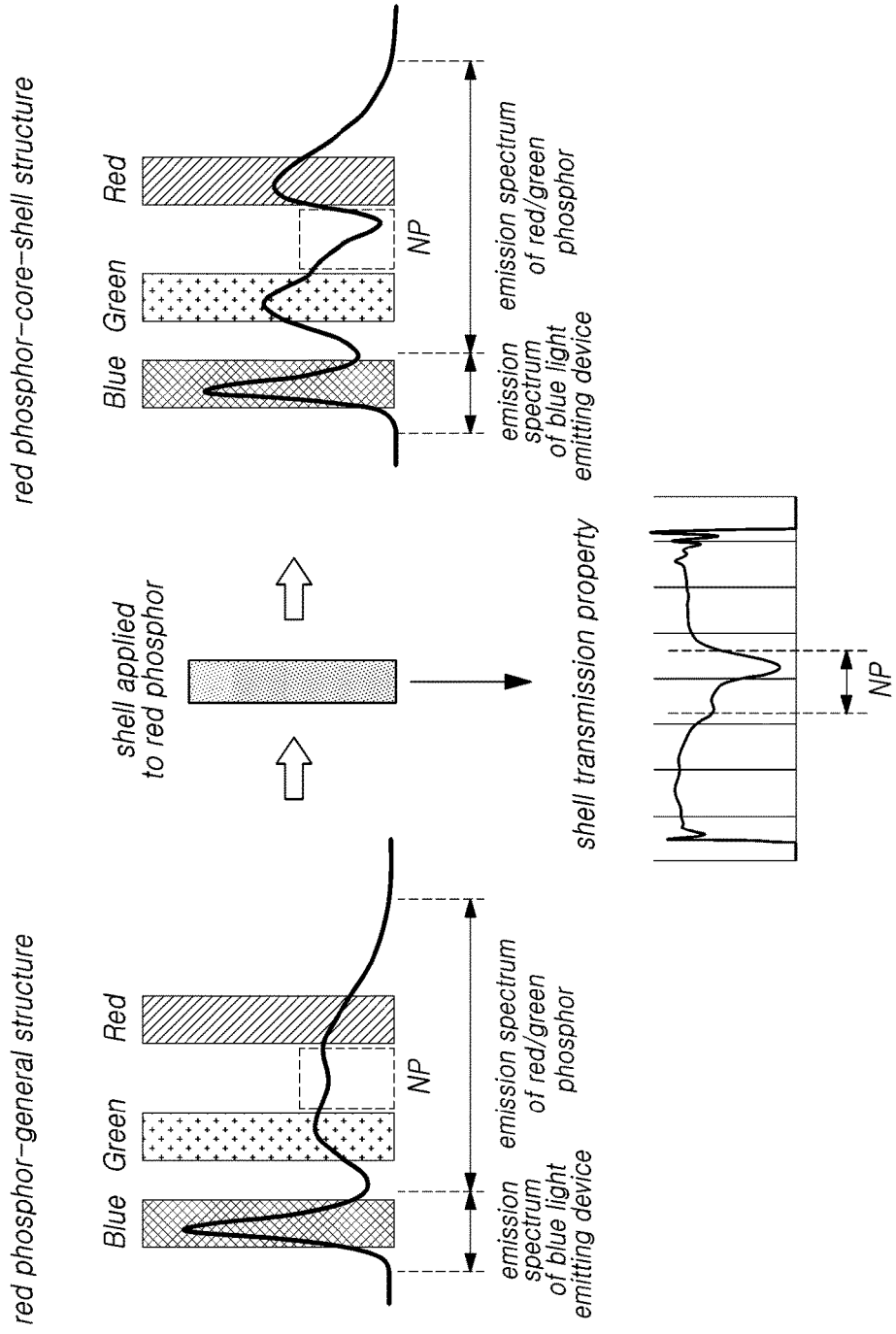
FIG. 17 shows emission spectra of the light-emitting device package in which the gamut of pure colors is improved as the core-shell structure of a red phosphor eliminates a G-R mixed color noise in accordance with some embodiment of the present invention.

Next, FIG. 17 shows emission spectra of the light-emitting device package 410 in which the gamut of pure colors is improved as the core-shell structure of the red phosphor eliminates a G-R mixed color noise in accordance with some embodiments of the present invention.

In the case of the light emitting device packages 410 of Types 1-a and 1-c (e.g., white light emitting device packages using blue light emitting devices, and red and green phosphors), a comparison is made of emission spectra between a light emitting device package in which the red phosphor has a structure according to related art lacking a shell and a light emitting device package 410 according to some embodiments of the present invention in which the red phosphor has a core-shell structure provided with a shell (refer to FIG. 17).

For a red phosphor having a structure according to related art consisting of a core without a shell, the emission spectrum shows the mixing of green and red colors because the intensity of the light in the G-R mixed color wavelength band (NP) is similar to those of the light in the pure green wavelength band and in the pure red wavelength band, without a significant difference therebetween.

As a result, the light-emitting device package according to related art cannot reproduce pure colors with a decrease in the emission performance of white light. A display apparatus or illumination apparatus employing the light-emitting device package according to related art may have greatly decreased color reproduction capability.

For a red phosphor having a core-shell structure provided with a shell, in contrast, the shell of the red phosphor absorbs the light of a G-R mixed color wavelength band (NP) from the light emitted by the core of the red phosphor to emit pure or substantially pure red color light that is free of or reduced in the light of a G-R mixed color wavelength band (NP).

As can be seen in the emission spectrum of the red phosphor having a core-shell structure provided with a shell, the intensity of light in the G-R mixed color wavelength band (NP) is greatly lower than light in a pure green wavelength band and in a pure red green wavelength band, so that the mixing of green and red colors is completely or substantially removed.

As a result, the light-emitting device package 410 according to some embodiments of the present invention can reproduce pure colors with the consequent increase of the emission performance of white light. An electronic apparatus 400, such as a display apparatus or illumination apparatus employing the light-emitting device package 410, may have greatly improved color reproduction capability.

Meanwhile, a higher content of the red phosphors having a core-shell structure in the encapsulant 620 allows the light finally emitted by the red phosphors to appear at a higher intensity in the emission spectrum, thereby further increasing the gamut of pure colors.

Figure 18:
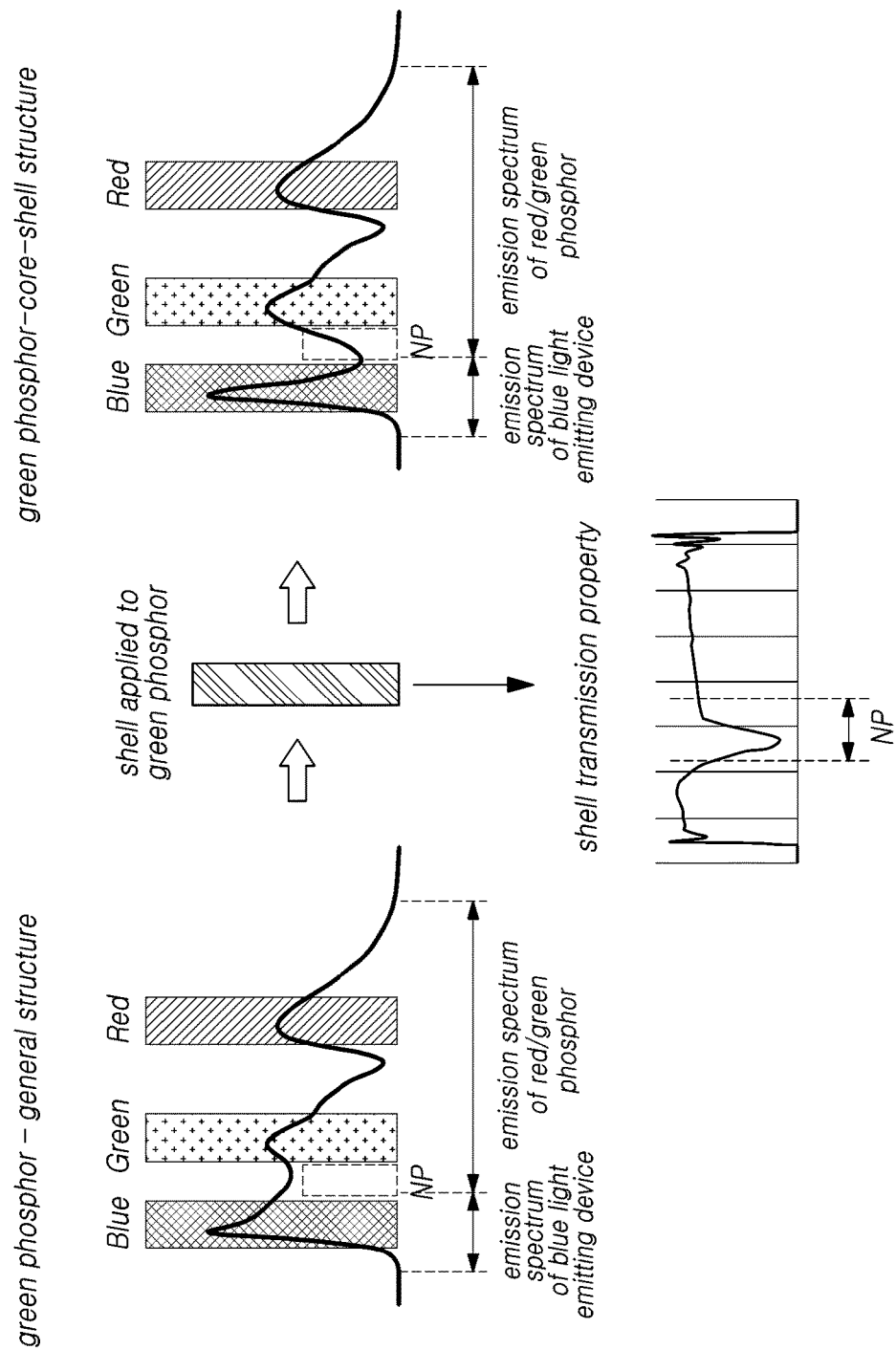
FIG. 18 shows emission spectra of the light-emitting device package in which the gamut of pure colors is improved as the core-shell structure of a green phosphor eliminates a blue-green (B-G) mixed color noise in accordance with some embodiment of the present invention.

Next, FIG. 18 shows emission spectra of the light-emitting device package in which the gamut of pure colors is improved as the core-shell structure of the green phosphor eliminates a B-G mixed color noise in accordance with some embodiments of the present invention.

In the case of the light emitting device packages 410 of Types 1-a and 1-b (that is, white light emitting device packages using blue light emitting devices, and red and green phosphors), comparison is made of emission spectra between a light emitting device package in which the green phosphor has a structure according to related art lacking a shell and a light emitting device package 410 according to some embodiments of the present invention in which the green phosphor has a core-shell structure provided with a shell, with reference to FIG. 18.

For a green phosphor having a structure according to related art consisting of a core without a shell, the emission spectrum shows the mixing of blue and green colors because the intensity of the light in the blue-green (B-G) mixed color wavelength band (NP) is similar to those of the light in the pure green wavelength band and in the pure blue wavelength band, without a significant difference therebetween.

As a result, the light-emitting device package according to related art cannot reproduce pure colors with a decrease in the emission performance of white light. A display apparatus or illumination apparatus employing the light-emitting device package according to related art may have greatly decreased color reproduction capability.

For a green phosphor having a core-shell structure provided with a shell, in contrast, the shell of the green phosphor absorbs the light of a B-G mixed color wavelength band (NP) from the light emitted by the core of the green phosphor to emit pure or substantially pure green color light that is free of or reduced in the light of a B-G mixed color wavelength band (NP).

As can be seen in the emission spectrum of the green phosphor having a core-shell structure provided with a shell, the intensity of light in a B-G mixed color wavelength band (NP) is greatly lower than light in a pure green wavelength band and in a pure blue wavelength band, so that the mixing of green and blue colors is completely or substantially removed.

As a result, the light-emitting device package 410 according to some embodiments of the present invention can reproduce pure colors with the consequent increase of the emission performance of white light. An electronic apparatus 400, such as a display apparatus or illumination apparatus employing the light-emitting device package 410, may have greatly improved color reproduction capability.

Meanwhile, a higher content of the green phosphors having a core-shell structure in the encapsulant 620 allows the light finally emitted by the green phosphors to appear at a higher intensity in the emission spectrum, thereby further increasing the gamut of pure colors.

As stated hitherto, the phosphor (P) having a core-shell structure can be applied to the light-emitting device package 410.

The light-emitting device package 410 may be used as a light source in an electronic apparatus, such as a display apparatus and an illumination apparatus.

Further, the phosphor (P) having a core-shell structure may find applications in supplementary color coversion layers for enhancing the color conversion performance of color filters.

Hereinafter, an electronic apparatus taking advantage of the light emitting device package 410 including a phosphor (P) having a core-shell structure according to some embodiments of the present invention will be described.

Figure 19:
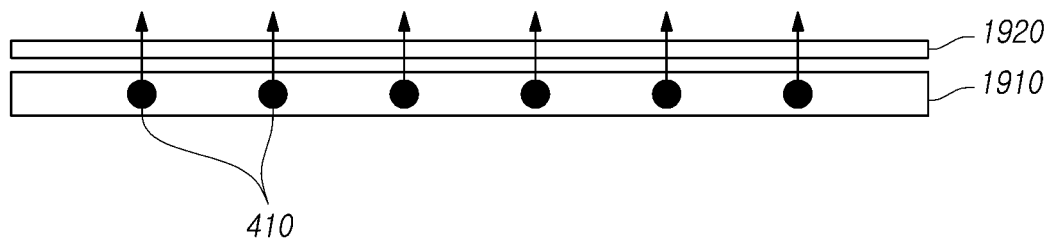
FIGS. 19 and 20 are schematic views illustrating a display apparatuses including two types of backlight units that utilize a light-emitting device package according to some embodiments of the present invention.
Figure 20:
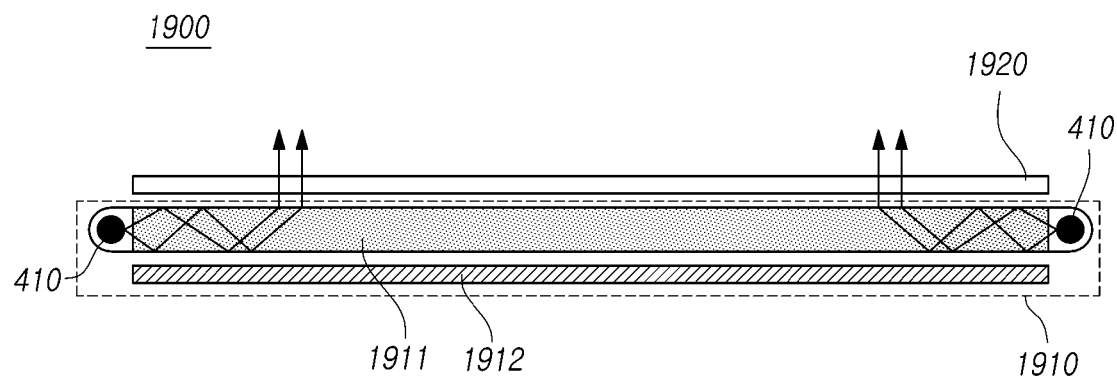
Figure 21:
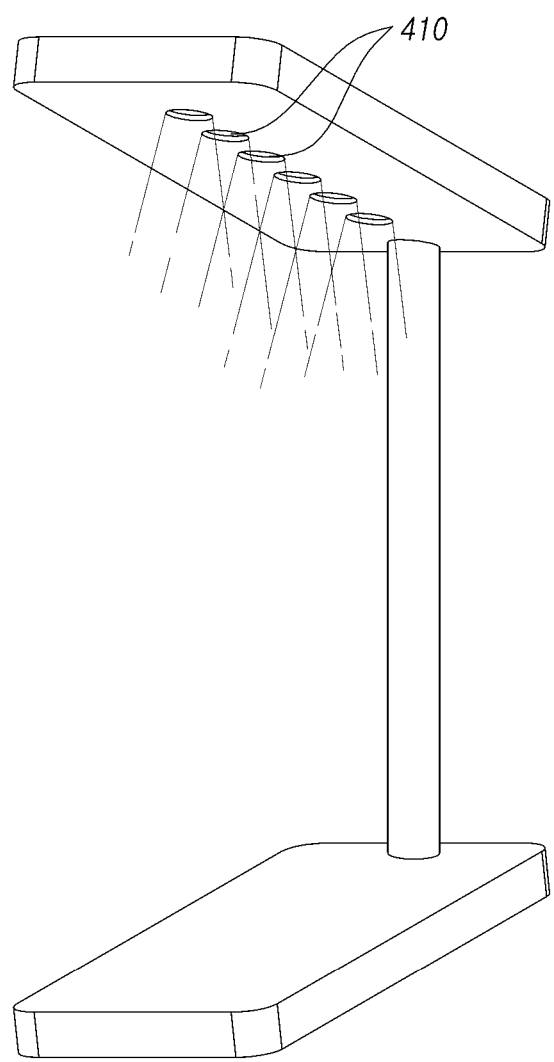
FIG. 21 is a schematic view illustrating an illumination apparatus that utilizes a light-emitting device package according to some embodiments of the present invention.

Next, FIGS. 19 and 20 are schematic views illustrating a display apparatus 1900 including two types of a backlight units 1910 that utilize a light-emitting device package 410 comprising a phosphor (P) having a core-shell structure according to some embodiments of the present invention, and FIG. 21 is a schematic view illustrating an illumination apparatus 2100 that utilizes a light-emitting device package 410 comprising a phosphor (P) having a core-shell structure according to some embodiments of the present invention. An electronic apparatus 400, such as a display apparatus 1900 and an illumination apparatus 2100 in accordance with some embodiments of the present invention, may include one or more light-emitting device packages 410, and one or more driving circuits 420, included in the light-emitting device packages 410, for operating light emitting devices (refer to FIGS. 19-21).

Each light-emitting device package 410 may include a first light emitting device emitting the light of a first main wavelength band (e.g., a blue wavelength band) within the visible light wavelength band, and a first phosphor emitting the light of a second main wavelength band different from the first main wavelength band.

The first phosphor may comprise a first core composed of a fluorescent material for emitting the light of a first wavelength band (e.g., a wavelength band including a green wavelength band and a green-red (G-R) mixed color wavelength band, a red wavelength band and a G-R mixed color wavelength band, or a green wavelength band and a B-G mixed color wavelength band) different from the first main wavelength band of the light emitted from the first light emitting device, and at least one first shell, applied to the surface of the first core, for emitting the light of a second main wavelength band (e.g., a green wavelength band or a red wavelength band) within the visible light wavelength band by eliminating the light of a first specific wavelength band (e.g., a green-red (G-R) mixed color wavelength band or a B-G mixed color wavelength band) or by attenuating the intensity of light of a first specific wavelength band from the light of the first wavelength band.

Utilizing as a light source the light emitting device package 410 including a phosphor having a core-shell structure, as stated above, the electronic apparatus 400, such as the display apparatus 1900 or the illumination apparatus 2100, can exhibit greatly improved color reproduction capability.

A light-emitting device package 410 including a phosphor having a core-shell structure may be positioned under a display panel 1920 to serve as a white light source for providing white light for the display panel 1920 (refer to FIG. 19). In other words, a direct-type light-emitting device package 410 including a phosphor having a core-shell structure may be used as a light source for a backlight unit 110. A light-emitting device package 410 including a phosphor having a core-shell structure may be used as a light source installed in an edge-type backlight unit 1910 including a light guide plate 1911 positioned under a display panel 1920 (refer to FIG. 20).

For an edge-type backlight unit 1910, the light-emitting device package 410 including a phosphor having a core-shell structure may be located at an edge portion of a display panel 1920.

The edge-type backlight unit 1910 may further comprise a reflector 1912 positioned under the light guide plate 1911.

Meanwhile, the phosphor P having a core-shell structure according to some embodiments of the present invention may serve to supplement the color conversion performance of a color filter.

Figure 22:
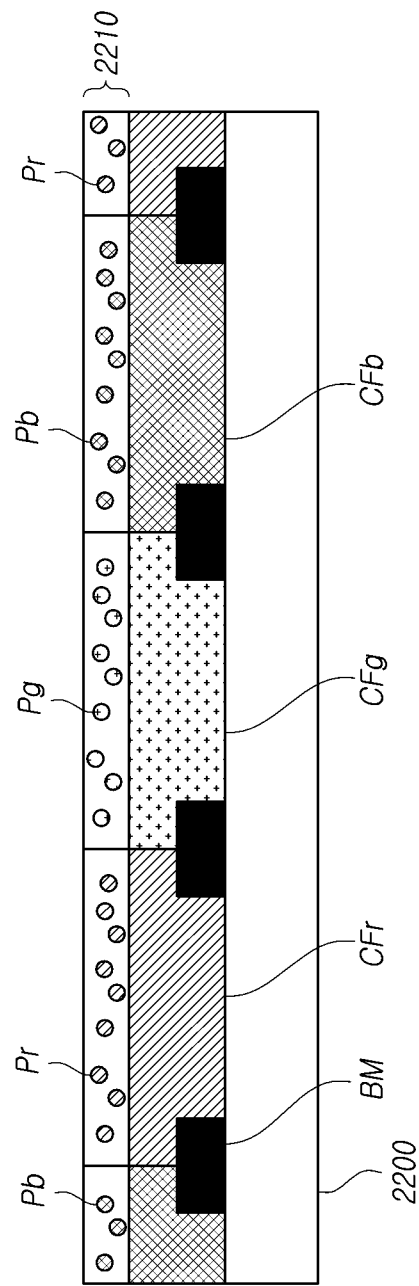
FIG. 22 is a view illustrating a display apparatus further including a supplementary color conversion layer that utilizes phosphors in a core-shell structure according to some embodiments of the present invention.

Next, FIG. 22 is a view illustrating a display apparatus 1900 further including a supplementary color conversion layer 2210 that utilizes phosphors (Pr, Pg, and Pb) in a core-shell structure according to some embodiments of the present invention. Phosphors (Pr, Pg, and Pb), each having a core-shell structure, according to some embodiment of the present invention may be contained in supplementary color conversion layers 2210 that are located beneath or on corresponding color filters (CFr, CFg, and CFb) so as to supplement the color conversion performance of the color filters (CFr, CFg, CFb).

A black matrix (BM) may be interposed between color filters (CFr, CFg, and CFb) and the supplementary color conversion layer 2210 may be composed of an encapsulant and the like containing the phosphors (Pr, Pg, and Pb) therein.

Located under or over a red color filter (CFr) may be a red phosphor (Pr) comprising a core which emits the light of a wavelength band including a red wavelength band and a mixed color wavelength band, and a shell which wraps the core and emits the light of a pure red wavelength band by removing the light of the mixed color wavelength band or by attenuating the intensity of the light of the mixed color wavelength band from the light emitted by the core.

Located under or over a green color filter (CFg) may be a green phosphor (Pg) comprising a core which emits the light of a wavelength band including a green wavelength band and a mixed color wavelength band, and a shell which wraps the core and emits the light of a pure green wavelength band by removing the light of the mixed color wavelength band or by attenuating the intensity of the light of the mixed color wavelength band from the light emitted by the core.

Located under or over a blue color filter (CFb) may be a blue phosphor (Pb) comprising a core which emits the light of a wavelength band including a blue wavelength band and a mixed color wavelength band, and a shell which wraps the core and emits the light of a pure blue wavelength band by removing the light of the mixed color wavelength band or by attenuating the intensity of the light of the mixed color wavelength band from the light emitted by the core.

Under or over all of the red color filter (CFr), the green color filter (CFg), and the blue color filter (CFb), corresponding color phosphors may exit. Alternatively, corresponding color phosphors may be positioned under or over one or two of the red color filter (CFr), the green color filter (CFg), and the blue color filter (CFb).

As elucidated hitherto, a phosphor that has a core-shell structure and exhibits an excellent gamut of pure colors is provided in accordance with some embodiments of the present invention.

A light-emitting device package 410 including a phosphor having a core-shell structure is provided in accordance with some embodiments of the present invention.

An electronic apparatus 400 that utilizes as a light source a light emitting device package including a phosphor having a core-shell structure is provided in accordance with some embodiments of the present invention.

An electronic apparatus 400 that exhibits high color reproduction capability by using a phosphor having a core-shell structure is provided in accordance with some embodiments of the present invention.

A phosphor having a core-shell structure can be used for controlling color coordinates in accordance with some embodiments of the present invention.

The above description and the accompanying drawings provide an example of the technical idea of the present invention for illustrative purposes only. Those having ordinary knowledge in the technical field to which the present invention pertains will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A light-emitting device package, comprising:
a light emitting device configured to emit light of a first main wavelength band within a visible light wavelength band;
a first phosphor including a first core and a first shell, the first core including a fluorescent material capable of emitting light of a first wavelength band different from the first main wavelength band of the light emitted from the light emitting device, the light of the first wavelength band having a first intensity that is greater than a threshold intensity,
wherein the first shell eliminates light of a specific wavelength band or attenuates an intensity of light of the specific wavelength band to below the threshold intensity from the light of the first wavelength band to emit light of a second main wavelength band within the visible light wavelength band, the light of the second main wavelength band having a second intensity that is less than the first intensity and less than the threshold intensity; and
a second phosphor including a second core.

2. The light-emitting device package according to claim 1, wherein a combination of the light emitting device, the first phosphor including the first core and the first shell, and the second phosphor including the second core improves a gamut of pure colors emitted and exhibits high color reproduction capability.

3. The light-emitting device package of claim 2, wherein a weight ratio of the first shell to the first core is 0.6 or less.

4. The light-emitting device package according to claim 3, wherein a thickness of the first shell is less than a distance from a center of the first core to a surface of the first core.

5. The light-emitting device package of claim 4, wherein the first shell includes at least one rare earth element in a lanthanum group.

6. The light-emitting device package of claim 5, wherein the first core includes at least one selected from among $(Sr,Ba,Mg)_2SiO_4$:Eu, $Al_5Lu_3O_{12}$:Ce, $(Sr,Ba,Mg)_2SiO_4$:Eu, $Y_3Al_5O_{12}$:Ce, $La_3Si_6N_{11}$:Ce, $(Sr,Ba,Eu)_2SiO_4$:Eu, β-Sialon:$Si_{6-z}Al_zO_zN_{8-z}$:Eu, $Lu_3Al_5O_{12}$:Ce, $(Lu, Gd)_3Al_5O_{12}$:Ce, and $Y_3Al_5O_{12}$:Ce (0.01<z<10).

7. The light-emitting device package of claim 6, wherein the first shell ranges in thickness from approximately 2,000 nm-500,000 nm.

8. The light-emitting device package of claim 7, wherein the light emitting device is a blue light emitting device and the first main wavelength band is a blue wavelength band,
wherein the first phosphor is a green phosphor and the first wavelength band is a green wavelength band, and
wherein the second phosphor is a red phosphor and a second wavelength band emitted by the second core is a red wavelength band.

9. A light-emitting device package, comprising:
a light emitting device configured to emit light of a first main wavelength band within a visible light wavelength band;
a first phosphor including a first core and a first shell,
wherein the first core includes a fluorescent material capable of emitting light of a first wavelength band different from the first main wavelength band of the light emitted from the light emitting device, the light of the first wavelength band having a first intensity that is greater than a threshold intensity, and
wherein the first shell eliminates light of a specific wavelength band or attenuates an intensity of light of the specific wavelength band to below the threshold intensity from the light of the first wavelength band to emit light of a second main wavelength band within the visible light wavelength band, the light of the second main wavelength band having a second intensity that is less than the first intensity and less than the threshold intensity; and
a second phosphor including a second core,
wherein the second core includes a fluorescent material capable of emitting light of a second wavelength band different from the first main wavelength band of the light emitted from the light emitting device.

10. The light-emitting device package according to claim 9, wherein a combination of the light emitting device, the first phosphor including the first core and the first shell, and the second phosphor including the second core improves a gamut of pure colors emitted and exhibits high color reproduction capability.

11. The light-emitting device package of claim 10, wherein the first shell includes at least one rare earth element in a lanthanum group.

12. The light-emitting device package of claim 11, wherein the first core includes at least one selected from among $(Sr,Ba,Mg)_2SiO_4$:Eu, $Al_5Lu_3O_{12}$:Ce, $(Sr,Ba,Mg)_2SiO_4$:Eu, $Y_3Al_5O_{12}$:Ce, $La_3Si_6N_{11}$:Ce, $(Sr,Ba,Eu)_2SiO_4$:Eu, β-Sialon:$Si_{6-z}Al_zO_zN_{8-z}$:Eu, $Lu_3Al_5O_{12}$:Ce, $(Lu, Gd)_3Al_5O_{12}$:Ce, and $Y_3Al_5O_{12}$:Ce (0.01<z<10).

13. The light-emitting device package according to claim 12, wherein the first core is heavier than the first shell.

14. The light-emitting device package according to claim 13, wherein a weight of the first shell and a weight of the first core are determined according to a weight ratio of the first shell to the first core to emit pure color light without degrading luminance performance.

15. The light-emitting device package of claim 14, wherein the weight ratio of the first shell to the first core is 0.6 or less.

16. The light-emitting device package of claim 15, wherein the light emitting device is a blue light emitting device and the first main wavelength band is a blue wavelength band, wherein the first phosphor is a green phosphor and the first wavelength band is a green wavelength band, and wherein the second phosphor is a red phosphor and the second wavelength band is a red wavelength band.

17. An electronic apparatus, comprising:

a light emitting device package including:
- a light emitting device configured to emit light of a first main wavelength band within a visible light wavelength,
- a first phosphor configured to emit light of a second main wavelength band different from the first main wavelength band, and
- a second phosphor including a second core; and a driving circuit configured to drive the light emitting device, wherein the first phosphor comprises:
- a first core including a fluorescent material capable of emitting light of a first wavelength band different from the first main wavelength band of the light emitted from the light emitting device, the light of the first wavelength band having a first intensity that is greater than a threshold intensity, and
- a first shell, applied to a surface of the first core, and configured to emit light of the second main wavelength band within the visible light wavelength band by eliminating light of a specific wavelength band from the light of the first wavelength band or by attenuating an intensity of the light of the specific wavelength band to below the threshold intensity, the light of the second main wavelength band having a second intensity that is less than the first intensity and less than the threshold intensity.

18. The electronic apparatus according to claim 17, wherein a weight ratio of the first shell to the first core is 0.6 or less, and wherein the first shell includes at least one rare earth element in a lanthanum group.

19. The electronic apparatus according to claim 18, wherein the first core includes at least one selected from among $(Sr,Ba,Mg)_2SiO_4$:Eu, $Al_5Lu_3O_{12}$:Ce, $(Sr,Ba,Mg)_2SiO_4$:Eu, $Y_3Al_5O_{12}$:Ce, $La_3Si_6N_{11}$:Ce, $(Sr,Ba,Eu)_2SiO_4$:Eu, β-Sialon:$Si_{6-z}Al_zO_zN_{8-z}$:Eu, $Lu_3Al_5O_{12}$:Ce, $(Lu, Gd)_3Al_5O_{12}$:Ce, and $Y_3Al_5O_{12}$:Ce ($0.01<z<10$).

20. The electronic apparatus according to claim 19, wherein the second core includes a fluorescent material capable of emitting light of a second wavelength band different from the first main wavelength band of the light emitted from the light emitting device, wherein the light emitting device is a blue light emitting device and the first main wavelength band is a blue wavelength band, wherein the first phosphor is a green phosphor and the first wavelength band is a green wavelength band, wherein the second phosphor is a red phosphor and the second wavelength band is a red wavelength band, and wherein the second phosphor includes a second shell.

* * * * *